United States Patent
Liu et al.

(10) Patent No.: US 9,023,253 B2
(45) Date of Patent: May 5, 2015

(54) CONDUCTIVE PASTE FOR FRONT ELECTRODE OF SEMICONDUCTOR DEVICE AND METHOD OF MANUFACTURING THEREOF

(71) Applicants: Xiaoli Liu, ShenZhen (CN); Ran Guo, Shenzhen (CN); Delin Li, San Jose, CA (US)

(72) Inventors: Xiaoli Liu, ShenZhen (CN); Ran Guo, Shenzhen (CN); Delin Li, San Jose, CA (US)

(73) Assignee: Soltrium Technology, Ltd, Shenzhen (CN)

( * ) Notice: Subject to any disclaimer, the term of this patent is extended or adjusted under 35 U.S.C. 154(b) by 0 days.

(21) Appl. No.: 13/787,997

(22) Filed: Mar. 7, 2013

(65) Prior Publication Data

US 2014/0220732 A1    Aug. 7, 2014

(30) Foreign Application Priority Data

Feb. 4, 2013  (WO) ................ PCT/CN2013/071352

(51) Int. Cl.
*H01B 1/02*     (2006.01)
*H01B 1/22*     (2006.01)
*H01L 31/0224*  (2006.01)

(52) U.S. Cl.
CPC .............................. *H01L 31/022425* (2013.01)

(58) Field of Classification Search
CPC ................. H01M 4/136; H01M 4/131; H01L 31/022425; H01L 2924/0002; Y02E 60/122
USPC ........... 252/512, 513, 514; 136/256; 429/523; 438/98, 660
See application file for complete search history.

(56) References Cited

U.S. PATENT DOCUMENTS

| | | | | |
|---|---|---|---|---|
| 3,282,737 | A  * | 11/1966 | Hintermann et al. | 429/523 |
| 8,257,617 | B2 * | 9/2012  | Klein et al. | 252/513 |
| 2011/0232747 | A1 * | 9/2011 | Mikeska et al. | 136/256 |
| 2011/0308595 | A1 * | 12/2011 | Carroll et al. | 136/256 |
| 2013/0043441 | A1 * | 2/2013  | Ozawa et al. | 252/513 |

* cited by examiner

*Primary Examiner* — Khanh Tuan Nguyen
(74) *Attorney, Agent, or Firm* — Fang Wu

(57) ABSTRACT

The present invention provides a conductive paste characterized by a crystal-based corrosion binder being combined with a glass frit and mixed with a metallic powder and an organic carrier. Methods for preparing each components of the conductive paste are disclosed including several embodiments of prepare Pb—Te—O-based crystal corrosion binder characterized by melting temperatures in a range of 440° C. to 760° C. and substantially free of any glass softening transition upon increasing temperature. Method for preparing the conductive paste includes mixture of the components and a grinding process to ensure all particle sizes in a range of 0.1 to 5.0 microns. Method of applying the conductive paste for the formation of a front electrode of a semiconductor device is presented to illustrate the effectiveness of the crystal-based corrosion binder in transforming the conductive paste to a metallic electrode with good ohmic contact with semiconductor surface.

15 Claims, 7 Drawing Sheets

CONDUCTIVE PASTE FOR FRONT ELECTRODE OF SEMICONDUCTOR DEVICE AND METHOD OF MANUFACTURING THEREOF

CROSS-REFERENCES TO RELATED APPLICATIONS

The present invention claims priority of a PCT application No. PCT/CN2013/071352 filed on Feb. 4, 2013, and incorporated by reference herein to its entirety for all purposes. The subject matter of the present application is also related to China Patent Application No. 201210360864.5, filed on Sep. 25, 2012, by Ran Guo, and U.S. patent application Ser. No. 13/730,939, filed on Dec. 28, 2012, by Ran Guo, commonly assigned and incorporated by reference herein to their entireties for all purposes.

BACKGROUND OF THE INVENTION

The present invention relates to a solar cell manufacture technique. More particularly, the invention is objected to provide an electrically conductive paste designated for forming front electrode of solar cells and methods for manufacturing the conductive paste.

Solar energy is an inexhaustible source of clean energy. With the increasing depletion of coal, oil and other non-renewable energy, development and use of solar energy have become a big trend of exploring renewable energy. The use of solar cells is a typical means of collecting solar energy, wherein the solar cell made by crystalline silicon is currently a major solar cell technology and will be in the market for substantially long time even though new generation thin-film solar cell has also been developed.

Crystalline silicon solar cells are in general composed of a front side electrode, an anti-reflective coating, an emitter, a P—N junction, a base, an aluminum back surface field, and a back electrode. The front side electrode collects photon-generated charge carriers near the front side electrode and supplies current.

The front electrode in crystalline silicon solar cells of the prior art is made from a conductive paste composed of silver powder, glass frit, one or more additives, and an organic carrier. Usually a glass frit in the electrically conductive paste has the following effects: a) wetting the metal powder to promote the sintering of the metal powder; b) etching the antireflective coating layer which is an insulating layer (e.g., silicon nitride) to promote the contact between the sintered metal and the silicon-based (n-type semiconductor) material. In order to achieve a good ohmic contact, the antireflective coating layer must be etched through but free from penetrating into the PN junction region of the silicon-based material.

The choice of the glass frit, its composition, softening point, thermal expansion coefficient, wetting properties, and amount (within the conductive paste), etc. will affect the physical and chemical changes of the conductive paste in the sintering process to form the electrode, thereby affecting the solar cell performance. In the sintering process, the glass frit material is gradually softened. Within a short process cycle, usually 1-2 minutes, part of the softened glass frit remains around the metal powder while another part of the softened glass frit material flows to reach the antireflective coating layer at bottom and induce an etching reaction there. On one aspect, the amount of the glass frit is an important factor affecting quality of the electrode, which also causes many physical constraints to the manufacture process. If the amount of the glass frit is not enough, there is no sufficient contact formed between the softened glass frit material and the antireflective coating layer to ensure that the antireflective layer is completely penetrated. If the glass frit is added too much, the probability of mutual contact between the conductive silver powders is too low so that the conductive phase among the as-formed electrode material becomes too scarce, causing the conduction performance of the front electrode of solar cell severely deteriorated. On another aspect, the glass frit is engineered through the selection of glass materials with a lower softening point, such as <400° C., in order to ensure that a sufficient amount of glass frit is deposited on the surface of the antireflective layer in the entire process, and therewith complete the etch reaction to remove the antireflective coating. But premature softening of the glass frit, can clog the communicating channels between the metal powders, and hinder the effective discharge of the organic carrier.

Pb—Si based glass materials usually are chosen for the manufacture of the front electrode paste. More recently, Pb—Te oxide and other oxide materials or fluoride materials are chosen to go through a series of processes of melting, mixing, and quenching the molten mixture to form a glass material before milling the glass material into the glass frit. However, regardless the use of various alternative materials, the nature of the glass material by itself sets many physical performance and chemical reaction constraints such as a narrow sintering process window for transforming the printed conductive paste to the electrode with desirable electrical conductivity while preventing from the emitter being penetrated. Presently, most of the conductive pastes on sale for manufacturing the front side electrodes of crystalline silicon based solar cells have these technical limitations.

BRIEF SUMMARY OF THE INVENTION

The objective of the present invention is to improve an electrically conductive paste for the manufacture of an electrode on a semiconductor surface. The electrically conductive paste is characterized by a strong adhesion property by adding a corrosion binder to form good ohmic contact with the semiconductor surface. In particular, the electrically conductive paste can be applied for forming a front electrode of a solar cell to improve overall light conversion efficiency. An alternative objective of the present invention is to provide a method of making the electrically conductive paste using a simple process with easy-controlled conditions and reduced production cost.

In a specific embodiment, the present invention provides an electrically conductive paste characterized by compositions including 70-93 wt % of an electrically conductive powder, 0.5-3.0 wt % of a glass frit, 0.5-15 wt % of a corrosion binder, and 5-25 wt % of an organic carrier, the corrosion binder being characterized by a plurality of particles with crystallized structure having 0.1~5.0 μm sizes and a fixed melting point.

In an alternative embodiment, the present invention provides a method for making the electrically conductive paste. The method includes providing a plurality of metal particles with a weight composition ranging from 70 to 93 wt % based on a given total weight of the conductive paste. Additionally, the method includes providing an organic carrier with a weight composition ranging from 5 to 25 wt % based on the given total weight. The method further includes providing a corrosion binder made from a plurality of Pb—Te—O-based crystalline particles and a glass frit made from a plurality of glass particles with a combined weight composition ranging from 1 to 15 wt % based on the given total weight. Furthermore, the method includes mixing the plurality of metal particles, the corrosion binder, the glass frit, and the organic carrier to form a mixture material. Moreover, the method includes grinding the mixture material to keep sizes of all the plurality of metal particles, the plurality of Pb—Te—O-based crystalline particles, and the plurality of glass particles substantially in a range of 0.1 to 5.0 µm.

In another alternative embodiment, the present invention provides a method for manufacturing a front electrode of a semiconductor device. The method includes providing a semiconductor device having an insulation surface coating. Additionally, the method includes printing a conductive paste material overlying a patterned region of the insulation surface coating. The conductive paste material includes a plurality of metal particles with a weight composition ranging from 70 to 93 wt % based on a given total weight of the conductive paste. The conductive paste material further includes a corrosion binder made from a plurality of Pb—Te—O-based crystalline particles and a glass frit made from a plurality of glass particles with a combined weight composition ranging from 1 to 15 wt % based on the given total weight. Furthermore, the conductive paste material includes an organic carrier with a weight composition ranging from 5 to 25 wt % based on the given total weight. The organic carrier dispersedly holds the plurality of metal particles, the plurality of Pb—Te—O-based crystalline particles, and the plurality of glass particles within the conductive paste material. All particles have sizes controlled in a range of 0.1 to 5.0 microns. Moreover, the method includes subjecting at least the conductive paste material and the patterned region in contact with the insulation surface coating to a sintering process with temperatures ramped up to about 800° C. followed by a cooling back. The temperature rise causes releasing of the organic carrier and melting of the corrosion binder after the releasing of the organic carrier along with softening of the glass frit and further causes sintering of the plurality of metal particles into a metallic bulk assisted by wetting effects from the molten corrosion binder and soften glass frit. Furthermore, etch-removing of the insulation surface coating at the patterned region is induced by the molten corrosion binder and softened glass frit and form an ohmic contact between the sintered metallic bulk and the semiconductor device.

Many advantages are provided when crystalline corrosion binders are added along with the glass frit as functional additives of the conductive paste for the manufacture of front electrodes of semiconductor devices. Specifically, the added crystalline corrosion binder is made from a Pb—Te—O-based crystal compound bearing ordered atomic structure and fixed melting point in contrary to the amorphous structure and wide range of softening temperatures associated with the glass frit made from even the same Pb—Te—O material with the same composition. These structural and physical property differences lead to different physical state transitions during the thermal process. According to embodiments of the present invention, the corrosion binder exits in the conductive paste as solid particles having dispersed space from metal particles and will not clog the intermediate regions between particles to prevent organic carrier's release. After melt, the liquid corrosion binder has very low viscosity and can flow down much faster than soften glass frit towards the insulation interface region for inducing an etching reaction to remove the insulation layer sufficiently within a shortened process cycle, resulting in better metal-semiconductor contact with reduced contact resistance. At the same time, the glass frit within the conductive paste according to embodiments of the present invention can have higher softening temperature ranges to reduce chances of clogging the release channel of organic carrier due to premature glass softening. Embodiments of the present invention also shows certain amount of glass frit plays important role in assisting the sintering of metal particles together to form a denser metallic bulk material of the electrode with enhanced weldability. These and other benefits will be described in more detailed throughout the present specification and particularly below.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

The present invention relates to a solar cell manufacture technique. More particularly, the invention is objected to provide an electrically conductive paste with novel ingredients and corresponding composition and also provide methods for manufacturing the electrically conductive paste. Merely by way of examples, the present invention provides methods for manufacturing the electrically conductive paste and applying the conductive paste for forming front electrode of silicon-based solar cells with improved electrical performance.

In an embodiment, the electrically conductive paste is made by, based on total weight of all materials thereof, 70-93 wt % of an electrically conductive powder, 0.5-3.0 wt % of a glass frit, 0.5-15 wt % of a corrosion binder, and 5-25 wt % of an organic carrier, wherein the corrosion binder is characterized by a plurality of particles with crystallized structure having 0.1~5.0 µm sizes and a fixed melting point. As defined, the organic carrier is counted as part of the total materials in the conductive paste composition.

Figure 1:
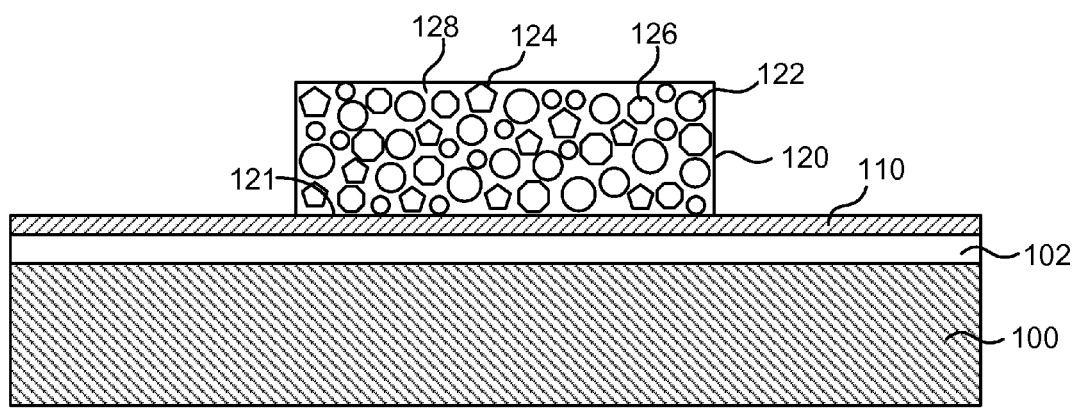
FIG. 1 is a cross sectional view of an electrically conductive paste printed on antireflection coating surface of a semiconductor substrate according to an embodiment of the present invention.

FIG. 1 is a cross sectional view of an electrically conductive paste printed on antireflection coating surface of a semiconductor substrate according to an embodiment of the present invention. This diagram is merely an example, which should not unduly limit the scope of the claims herein. One of ordinary skill in the art would recognize other variations, modifications, and alternatives. As shown, a cross sectional view of an electrical conductive paste 120 is applied on a surface 110 of a semiconductor device, which comprises semiconductor substrate 100, emitter 102, and insulating layer 110, by screen printing technique. The electrical conductive paste 120 includes several solid ingredients provided in powder form including a metallic powder 122, a glass frit 124, and a corrosion binder 126, mixed with an organic carrier 128. The semiconductor device can be made by semiconductor substrate 100 having an emitter 102 and insulating layer 110 coated over the emitter surface. The conductive paste 120 is only disposed on a patterned region 121 (for example, a pre-patterned line) with substantially all the inorganic powder materials (122, 124, and 126) carried by the organic media 128 to penetrate through the printing screen and form a contact at its bottom region 121 with the insulating layer 110. In a specific embodiment, the semiconductor device is a silicon-based solar cell and the insulating layer 110 is an anti-reflective coating (e.g., $SiN_x$ material).

Figure 2:
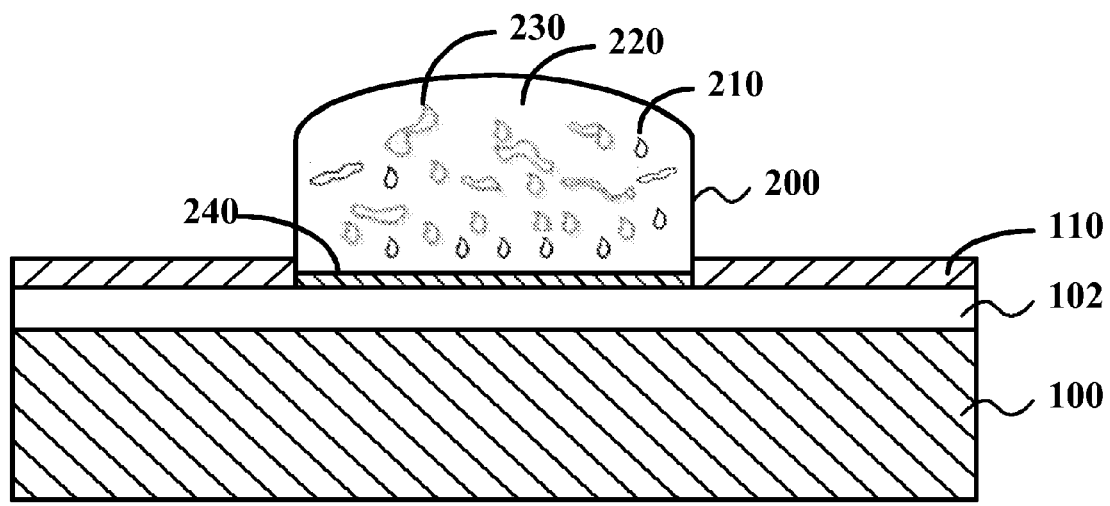
FIG. 2 is a cross sectional view of an electrode transformed from the electrically conductive paste on the semiconductor surface via a sintering process according to an embodiment of the present invention.

FIG. 2 is a cross sectional view of an electrode transformed from the electrically conductive paste on the semiconductor surface via a sintering process according to an embodiment of the present invention. This diagram is merely an example, which should not unduly limit the scope of the claims herein. One of ordinary skill in the art would recognize other variations, modifications, and alternatives. As shown, the conductive paste 120 is subjected to a thermal treatment process with a baking at about 250° C. followed by ramping to temperatures around 800° C. for the formation of a front electrode 200 on the emitter 102 of the semiconductor device. The thermal treatment process is a sintering process to bond the originally dispersed metallic powder 122 into a metallic bulk material 220 and to cause an etching reaction, assisted by the liquid or molten corrosion binder 210 and soften glass phase 230, to form an ohmic contact layer 240 between the bulk material 220 and emitter 102 of the semiconductor device. The etching reaction leads to a substantially complete removal of all insulating layer 110 within the interface region to form an ohmic contact layer 240 between the sintered metallic bulk 220 and the emitter 102 of the semiconductor device. The ohmic contact layer 240 comprises bulk material 200 and residue of the etching reaction of the anti-reflective coating. At the interface region, a conduction path is formed as temperature further cooled down from a peak value (around 800° C.) via metal precipitate colloids and crystal grains structures to connect the metallic bulk material 220 and the emitter 102 of the semiconductor device. As a result, the metallic bulk 220 is transformed into an electrode having a good ohmic contact with the emitter 102 of the semiconductor device. As disclosed throughout the specification, the transformation process of the conductive paste to the electrode is highly depended on the physical and chemical nature of the conductive paste and specially depended on the individual ingredient therein. Upon the illustrations of each ingredient provided according to embodiments of the present invention in following sections of the specification, the improvement in the new conductive paste and manifestations of the electrodes formed from the conductive paste on the performance of associated silicon-based solar cells will be revealed.

In an embodiment of the present invention, the electrically conductive paste for forming a front electrode of crystalline silicon based solar cells uses a glass frit with relatively high glass softening temperatures ranging from 500° C. to 650° C. mixed with a corrosion binder with crystalline structure, so that the front electrode formed from corresponding conductive paste can substantially improve integrated performance of the crystalline silicon solar cells. When a conventional conductive paste uses only glass frit as additive in addition to the electrically conductive powder, the glass frit usually is made by materials having glass softening temperatures starting at 300° C. for effectively etching an insulating layer on top of the semiconductor surface and facilitating a formation of sintered conductive bulk from the powders. However, this approach requires relative larger amount of the glass frit based on 100% total weight of the conductive paste. A consequence of more glass frit in the conductive paste is high contact resistance and high series resistance through the as-formed electrode. Also it is difficult to control how fast the softened glass frit sinks towards the insulating layer region and corresponding etching rate of the insulating layer during the sintering process unless the sintering process window is delicately fine-tuned, thereby increasing production cost.

When adding crystalline corrosion binder material with a melting point about 440-760° C. (depending on specific chemical compound used) into the glass frit, glass materials with relatively high softening temperatures that are closer to the melting point can be chosen to make the glass frit so that the organic carrier can be substantially released before the glass frit softens or the corrosion binder crystal melts to avoid the clog at inter-particle spacing without block the releasing channel of the organic carrier. Once the sintering temperature reaches the melting point of crystalline corrosion binder, it quickly turns into liquid phase and sink through the conductive powders with very low viscosity so that the liquid phase can wet the particles of the conductive powders and also sink down to reach the insulating layer on the semiconductor device to induce an etching reaction to remove the insulating layer. The softened glass frit, if their softening temperatures are around the melting point above, also starts their role in wetting the conductive powders and slowly flowing downward to reach the insulating layer and to participate in the etching reaction for removing the insulating layer. As a result of adding crystalline corrosion binder, the etching reaction at the insulating layer occurs faster and more complete while the etching depth can still be controlled to avoid over-etching into the emitter 102 of the semiconductor device by limiting the amount of corrosion binder as well as the glass frit. Another advantage of adding crystalline corrosion binder, the conductive powders can be wetted easier and quicker because of existence of low viscosity liquid phase in addition to the relative high viscosity glass phase. The wetted particles promote the sintering process to transform a plurality of conductive powders into a bulk material and more effective sintering leads to a formation of a denser bulk conductor material (used as electrode), yielding a lower electrical resistance and stronger soldering strength for connecting external electrical leads. Therefore, by adding crystalline corrosion binder as an alternative additive along with traditional glass frit for the formation of a conductive paste many advantages can be realized for the manufacture of solar cells in terms of higher photovoltaic conversion efficiency, higher open circuit voltage, higher short-circuit current, lower series resistance, and higher filling factor. More details on each composition components within the conductive paste according to embodiments of the present invention are given below.

Glass Frit

In an embodiment of the present invention, the glass frit as an additive of the conductive paste is formed from materials that have the softening temperature ranged from 500° C. to 650° C. Specifically, the glass frit is selected from one of the group of Pb—Si—O, Pb—B—O, Pb—Te—O, Bi—Si—O, Bi—B—O, Bi—Te—O, P—Zn—Na—O, B—Al—Na—O, B—Zn—Ba—O, and V—P—Ba—O based glass materials. The dimension of the glass fits is between 0.1 μm and 5.0 μm.

In a specific embodiment, the glass frit is Pb—Si—Al—B—O based glass wherein the weight percentage of its ingredients (based on total solids of the glass frit) can be:
PbO 65~85 wt %,
$SiO_2$ 10~20 wt %,
$Al_2O_3$ 0.1~10 wt %,
$B_2O_3$ 0.1~10 wt %, and
additional oxide 0~5 wt %, which include a metal oxide of one of following metal elements: Li, Na, K, Mg, Ca, Sr, Ba, Ti, Zr, Sc, Zn, and Bi or other chemicals that can decompose into the metal oxide just mentioned.

In another specific embodiment, the glass frit is Bi—Si—B—Zn—O based glass wherein the weight percentage of its ingredients (based on total solids of the glass frit) can be:
$Bi_2O_3$ 65~85 wt %,
$SiO_2$ 10~20 wt %,
$B_2O_3$ 0.1~10 wt %,
ZnO 0.1~10 wt %, and
additional oxide 0~5 wt %, which include a metal oxide of one of following metal elements: Li, Na, K, Mg, Ca, Sr, Ba, Ti, Al, Zr, Sc, W, Co, Cu, Fe, Ni, Sn, Mn, and Ag or other chemicals that can decompose into the metal oxide just mentioned.

In yet another specific embodiment, the glass frit is Zn—B—P—Li—O based glass wherein the weight percentage of its ingredients (based on total solids of the glass frit) can be:
$B_2O_3$ 0.1~10 wt %,
ZnO 30~50 wt %,
$P_2O_5$ 30~50 wt %,
$Li_2O$ 0.1~10 wt %, and
additional oxide 0~5 wt %, which include a metal oxide of one of following metal elements: Na, K, Mg, Ca, Sr, Ba, Ti, Al, Zr, Sc, Ni, Co, Cu, Fe, Sn, Mn, Ag, Co, Bi, and Ga or other chemicals that can decompose into the metal oxide just mentioned.

In still another specific embodiment, the glass frit is B—Al—Li—O based glass wherein the weight percentage of its ingredients (based on total solids of the glass frit) can be:
$B_2O_3$ 60~85 wt %,
$Al_2O_3$ 3~30 wt %,
$Li_2O$ 1~10 wt %, and
additional oxide 0~5 wt %, which include a metal oxide of one of following metal elements: Na, K, Mg, Ca, Sr, Ba, Ti, Zr, Sc, Zn, Co, Cu, Fe, Sn, Mn, and Ag or other chemicals that can decompose into the metal oxide just mentioned.

In still yet another specific embodiment, the glass frit is Pb—Te—Li—O based glass wherein the weight percentage of its ingredients (based on total solids of the glass frit) can be:
PbO 20~50 wt %,
$TeO_2$ 40~70 wt %,
$Li_2O$ 0.1~10 wt %, and
additional oxide 3~15 wt %, which include a metal oxide of one of following metal elements: Na, K, Mg, Ca, Sr, Ba, Ti, Si, B, Al, Zr, Sc, Zn, Co, Cu, Fe, Sn, Mn, and Ag or other chemicals that can decompose into the metal oxide just mentioned.

In still further another specific embodiment, the glass frit is Na—Al—B—O based glass wherein the weight percentage of its ingredients (based on total solids of the glass frit) can be:
$Na_2O$ 5~20 wt %,
$Al_2O_3$ 5~40 wt %
$B_2O_3$ 35~75 wt %, and
additional oxide 0~5 wt %, which include a metal oxide of one of following metal elements: Li, K, Mg, Ca, Zn, Sr, Ba, Ti, Zr, Sc, Si, Ni, Co, Cu, Fe, Sn, Mn, and Ag or other chemicals that can decompose into the metal oxide just mentioned.

In furthermore another specific embodiment, the glass frit is Bi—V—Ba—P—O based glass wherein the weight percentage of its ingredients (based on total solids of the glass frit) can be:
$V_2O_5$ 45~60 wt %
$Bi_2O_3$ 5~25 wt %
BaO 5~25 wt %
$P_2O_5$ 15~30 wt %, and
additional oxide 0~5 wt %, which include a metal oxide of one of following metal elements: Li, K, Mg, Ca, Si, Zn, Sr, Ba, Ti, Zr, Sc, Cr, Co, Cu, Fe, Sn, Mn, Sb, and Ag or other chemicals that can decompose into the metal oxide just mentioned.

Corrosion Binder

The corrosion binder added into the conductive paste according to embodiments of the present invention is a crystalline compound, having a fixed melting point substantially free from any glass softening transition. In certain embodiments, the corrosion binder is at least one selected from the following lead-tellurium-based crystalline oxide compounds: $PbTe_4O_9$, $PbTeO_3.0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{1.5}O_7$, $Pb_5TeO_7$, $Pb_5TeO_7$, $Pb_6Te_5O_{18}.5H_2O$, $PbTe_4O_9$, $PbTe_2O_5$, $PbH_4TeO_6$, $PbTeCO_5$, and $Pb_3TeN_2O_8$ or a mixture with two or more of them, having a melting temperature between 440° C. and 760° C. The melting temperature value for any actual supplied corrosion binder, of course, is depended on the composition of the compounds. The corrosion binder is prepared as a plurality of particles, having typical crystalline characteristics, unlike the convention glass frit additive being provided as a plurality of glass particles without a fixed melting point instead a wide softening temperature range.

In a specific embodiment, the crystal-based corrosion binder is provided with at least one shape selected from sphere, droplet, aciculate, dendritic-shape, massive, spherical-shape, flake, granular-shape, colloidal-particle-shape or a combination of any two or more of them and each particle size is controlled to be in a range of 0.1~5.0 μm. When the corrosion binder particle diameter is less than 0.1 μm, the corrosion binder particles do not match with the metal powders (more details are given below) in the conductive paste, which do not facilitate the sintering process by causing a dispersing effect. If the corrosion binder particle diameter is more than 5.0 μm, the as-formed paste is difficult for screen printing during its application onto semiconductor device surfaces as the large particles are difficult to pass through screening. The corrosion binder can be prepared by one of the following methods: liquid phase chemical reaction; gas-phase chemical reaction; molten reaction and controlled cooling method; vacuum melting and controlled cooling method. More details on the corrosion binder preparation methods are described below.

In a specific embodiment, the crystal corrosion binder selected for the conductive paste is a Pb—Te—O-based crystal material is prepared using a liquid phase chemical reaction method. In particular, a Tellurium-based compound solution is mixed with Lead Acetate solution. The mixed solution is stirred at 80~150° C. while maintaining the stirring speed in a range of 800~2500 r/min. to cause a chemical reaction. The reaction, after 2~4 hours, produces solid precipitate which can be collected by a solid-liquid separation. The solid precipitate is washed until PH value of the filtrate is about 5~7, then the solid precipitate is accumulated and dried at about 150° C. for 2 hours. Afterward, the dried solid includes one or more types of Pb—Te—O-based crystal compounds characterized by melting temperatures within a range of 440 to 760° C. Fine powders (having particle size ranging between 0.1 and 5.0 microns) of these Pb—Te—O-based crystal compounds are used as the corrosion binder additive of the conductive paste. Of course, many variations, alternatives, and modifications in the process conditions may be applied depending on embodiments to form similar Pb—Te—O-based crystal compounds with their melting temperatures and particle sizes in the above desired range.

In the above reaction process, the Tellurium-based compound solution is a telluric acid solution with or without oxygen deficit, or a Tellurite solution with or without oxygen deficit. The solution concentration is in a range of 0.1~6 mol/L. Correspondingly the Lead Acetate solution concentration is in a range of $0.1~10^8$ μmol/L. The proportion of the two reactants, tellurium-based compound and Lead Acetate, can be added in accordance with the molar relationship of the chemical reaction equation, such as the molar ratio of 1:1. Of course, in order to drive the chemical reaction to a forward direction for improving a formation rate of the Pb—Te—O-based crystalline compound precipitate, the added amount of one reactant may be an appropriate excess.

In another specific embodiment, the crystal corrosion binder selected for the conductive paste is a Pb—Te—O based crystal material is prepared using a gas-phase chemical reaction method. The method includes continuously introducing $Pb_xTe_y$ alloy vapor into a reaction chamber under oxygen atmosphere and inducing chemical reaction for forming the Pb—Te—O-based crystal compound. In the embodiment, the molar ratio of Pb and Te is set to 2:3, or 1:1, or 1:4 or 3:1. The reaction chamber is set at about 1000~1400° C. for about 2~4 hours. Then heating is stopped in the chamber to allow a powder-like material obtained from the reaction to accumulate at a bottom region of the chamber. As it is cooled naturally the Pb—Te—O-based crystalline compound is collected as a powder material. Of course, many variations, alternatives, and modifications in the process conditions may be applied depending on embodiments to form Pb—Te—O-based crystalline powders with similar properties.

In still another specific embodiment, the crystal corrosion binder selected for the conductive paste is a Pb—Te—O-based crystal material is prepared using a molten reaction and controlled cooling method. In this method, the Tellurium Oxide and Lead Oxide in their solid phases are provided in a furnace to start a solid phase reaction at 500~900° C. The reaction product is pulverized after natural cooling and further milled to form the Pb—Te—O-based crystal compound in powder form. In certain implementations, Tellurium Oxide and Lead Oxide are provided with one of the following molar ratios: 2:3, 1:1, 1:4 or 3:1. In particular, the Tellurium Oxide is $TeO_2$, Lead Oxide is PbO or other oxides. The reaction can be carried out in a high temperature furnace. The Pb—Te—O-based crystal compound is generated by crushing, grinding, milling the solid phase reaction product, preferably forming a powder material with particle diameters within a range of 0.1~5.0 μm. Of course, many variations, alternatives, and modifications in the process conditions may be applied depending on embodiments to form Pb—Te—O-based crystalline powders with similar properties. For example, after Tellurium Oxide and Lead Oxide are molten and mixed, heated air flow or inert gas flow (such as $N_2$, Argon, etc.) may be introduced to flow through the surface of the melt for reducing the cooling rate to obtain the Pb—Te—O-based crystal compound.

In yet still another specific embodiment, the crystal corrosion binder in the conductive paste is a Pb—Te—O-based crystal material prepared using a vacuum melting and controlled cooling method. In a vacuum furnace, a mixture of Tellurium Oxide and Lead Oxide with a molar ratio of 2:3, or 1:1, or 1:4 or 3:1, is melted and further mixed at 500~900° C. After the process, the melt is cooled naturally within the furnace, or cooled in air outside the furnace, or slowly cooled following a predetermined cooling temperature profile to form a bulk material. The Pb—Te—O-based crystal compound is generated as a powder material having particle size substantially in a range of 0.1 to 5.0 μm by crushing, grinding, milling the bulk material. Of course, many variations, alternatives, and modifications in the process conditions may be applied depending on embodiments to form Pb—Te—O-based crystalline powders with similar properties. For example, after Tellurium Oxide and Lead Oxide are molten and mixed, heated air flow or inert gas flow (such as $N_2$, Argon, etc.) may be introduced to flow through the surface of the melt for reducing the cooling rate to obtain the Pb—Te—O-based crystal compound.

The crystal corrosion binder is distinctly different from the conventional glass frit in terms of its internal atomic structure. Each particle in the prepared corrosion binder is a crystalline compound having ordered atomic structure while each glass frit particle is in an amorphous structure with a random atomic network. Significant difference can be shown by X-ray diffraction (XRD) measurement. XRD scan of a corrosion binder sample yields several sharp peaks at certain diffraction angles that are specifically associated with the corresponding crystalline compound. While XRD scan of a glass frit material shows a mostly flat distribution and only a small bump of low strength near the small diffraction angles region. Additionally, the structural difference between the crystalline corrosion binder and the glass frit can be directly revealed by transmission electron microscopy (TEM) image. When a TEM image of the crystalline compound of any one of the corrosion binder added into the conductive paste of the present invention is taken, it demonstrates a surface with ordered atomic arrangement. But TEM image of any glass frit exhibits a surface with disordered atomic arrangement.

Additional difference between crystalline corrosion binder and glass frit may resulted from their preparation methods, even though they may be started from substantially same oxide material with very similar compositions. Conventional glass frit is typically formed by first heating the oxide material till melt followed by quenching the melt in certain processes. For example, U.S. Patent Publication No. US2011/0308595 discloses a conductive paste for front electrode of crystalline silicon solar cell. The conductive paste includes a glass frit made from lead tellurium oxide (Pb—Te—O) material. A method of glass frit preparation is shown as follows: lead oxide and tellurium oxide are mixed first, and heated to a molten state in an atmosphere of air or under an oxygen atmosphere; then, the molten material is subjected to a quenching process to form a solid material; the solid material is ground or milled to form the lead tellurium oxide (Pb—Te—O)-based glass frit. In another example, PCT Patent Pub. No. WO2012/129544 discloses a similar melting-and-quenching method for preparing a glass frit using several different lead oxides and tellurium oxides as raw materials. The glass frit obtained has a softening temperature zone of 300~800° C. In another example, US Patent Pub. No. US2011/0232747 discloses a method of preparing glass frit by mixing $TeO_2$, PbO, and $Li_2CO_3$ row materials, heating up to 900° C. to melt and holding for molten state mixture for one hour, then quenching the molten mixture to form Pb—Te—

O-based glass frit. In yet another example, US Patent Pub. No. US2011/0232746 also discloses a method for preparing the glass frit. This glass frit is non-crystal and does not have a fixed melting temperature. From a dynamics perspective, the crystallization process must overcome a certain energy barrier, including interfacial energy for nucleation and activation energy for new nuclei to grow up via atomic diffusion. If the energy barrier is relatively high and the cooling rate of the material from melt is too fast to cause viscosity increasing greatly so that no sufficient movement of atoms exists for overcoming the barrier for cause a regular atomic arrangement. Therefore, the quenching process proposed in the prior art, which is essentially a super-cooling process, substantially results in formation of a glass state material with amorphous structure instead of leading to formation of crystalline nuclei and growth of a crystal structure. Alternatively, by changing the cooling process to reduce the cooling rate substantially, the molten mixture formed from same raw material can be transformed into crystalline solid compound. Of course, there are many other methods for forming crystalline compounds from certain raw materials other than using a melting-and-cooling process.

In one or more embodiments, the differences in structures and preparation methods between a Pb—Te—O based glass material and crystalline compounds are illustrated by following examples.

Figure 3:
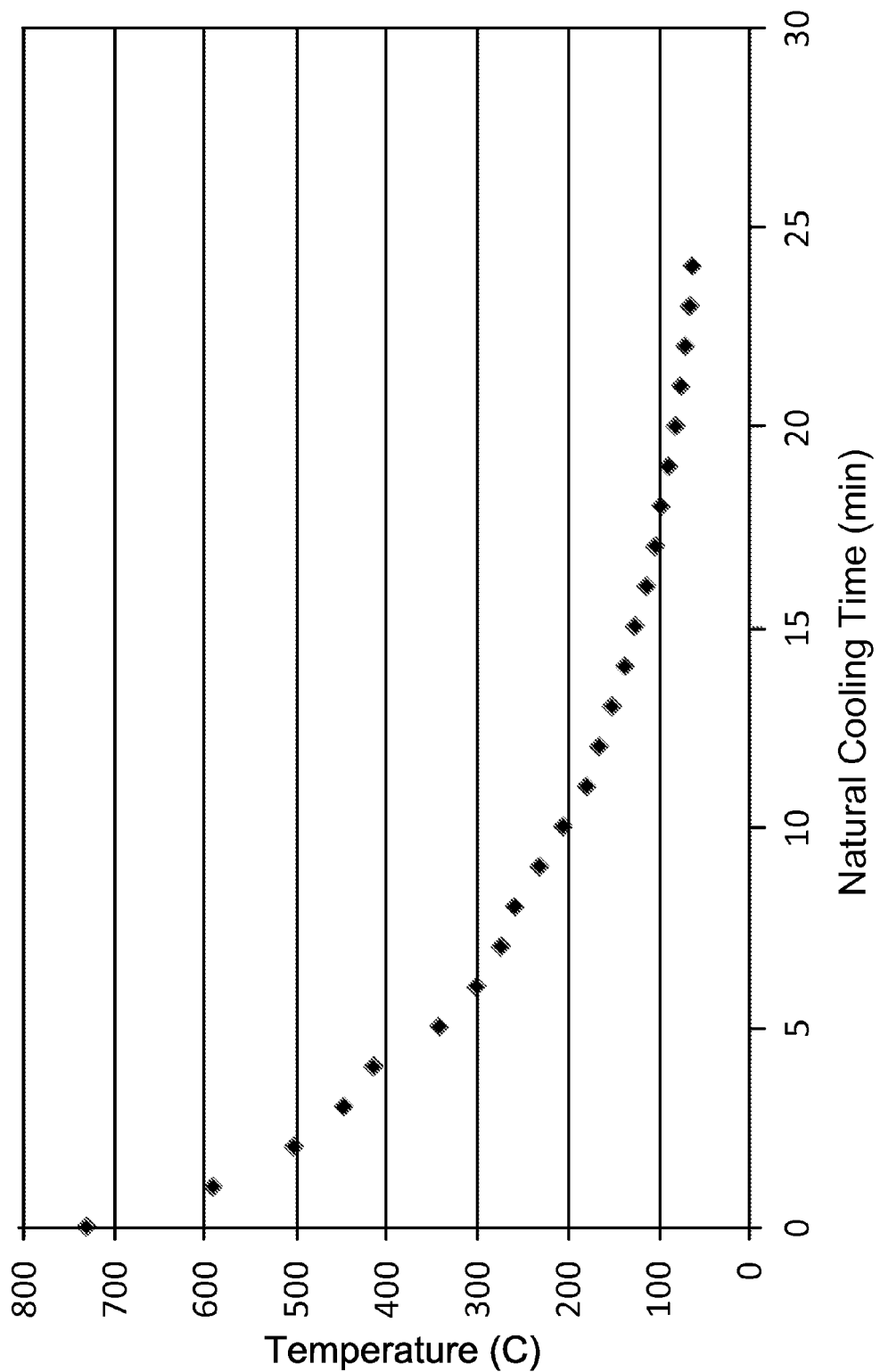
FIG. 3 is an exemplary diagram showing a process temperature profile for preparing crystalline corrosion binder according to an embodiment of the present invention.
Figure 4:
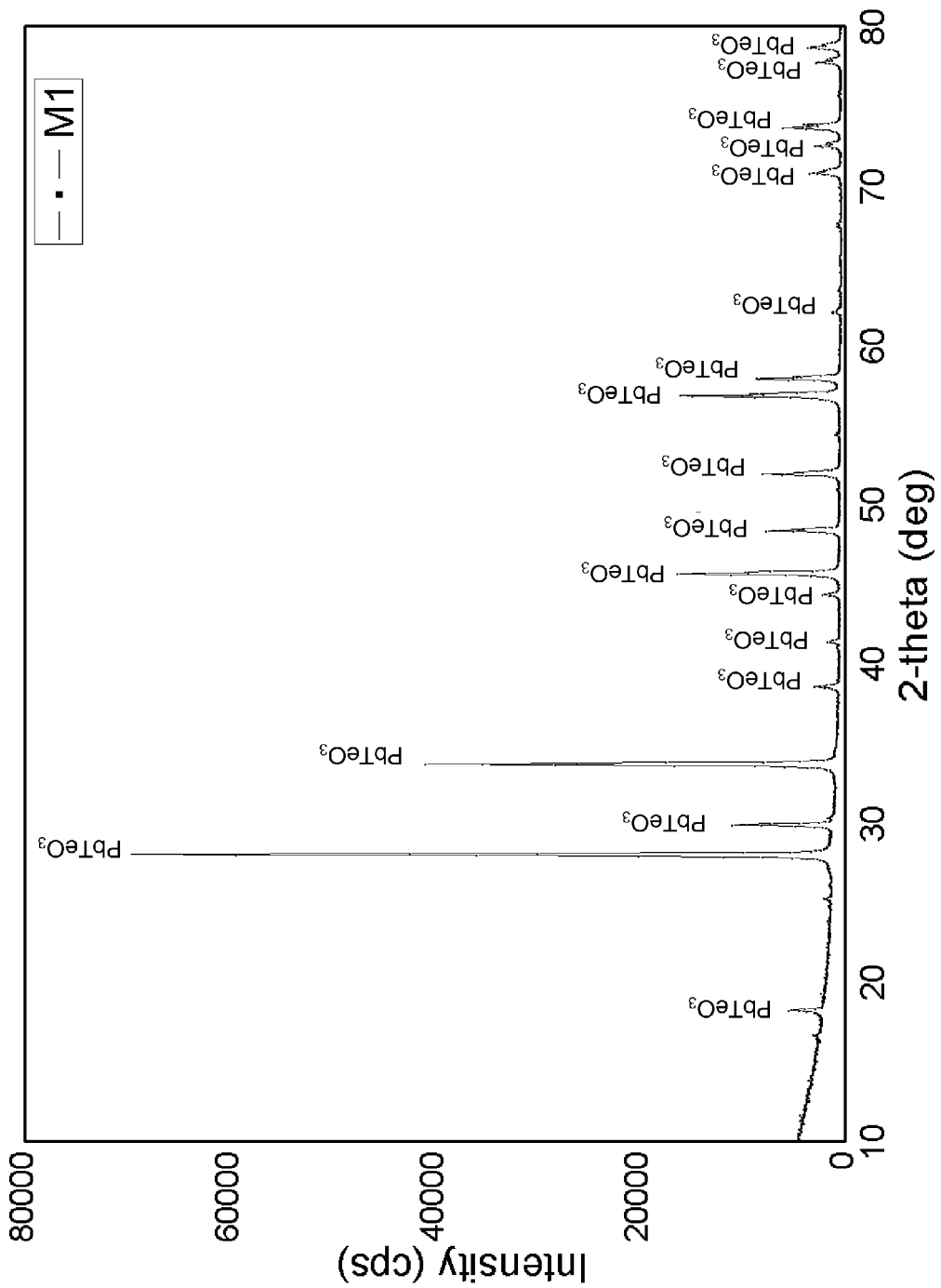
FIG. 4 is an exemplary diagram of XRD measured from a corrosion binder, as an ingredient in the electrically conductive paste, showing crystalline characteristics according to a specific embodiment of the present invention.

In an example according to an embodiment of the present invention, chemical compound $TeO_2$ and PbO in powder forms are mixed with a mole ratio of 1:1. After mixing, the mixture is heated in air environment to about 800° C. (which is above the melting point of either chemical compound) and is further held at the temperature for about 30 minutes to form a molten mixture. Then the molten mixture is removed from furnace and cooled naturally in a room-temperature atmosphere to form a bulk material. Upon the removal from the furnace, the temperature of the molten mixture is first cooled from 800° C. in the furnace to 732° C. in 3 seconds with an average cooling rate of 1360° C./min. FIG. 3 shows a plot of temperature drop after removal of the molten mixture from furnace versus its cooling time in a process for preparing the corrosion binder according to an embodiment of the present invention. As shown, the recording starts from 732° C. and the temperature drops to 593° C. in the first 1 minute. The average cooling rate is about 139° C./min. In a second minute, the temperature drops further to 504° C. with an average cooling rate of 89° C./min. In a third minute, the temperature drops to 449° C. with an average cooling rate of 55° C./min. Furthermore, in a fourth minute, it drops to 416.8° C. with an average cooling rate of 32.8° C./min. At this stage, the molten mixture has become a bulk material. The bulk material is crushed into small particles and further ball-milled into fine powders with substantially round shape having $D_{50}$ sizes ranging from 0.1 to 5 μm. Using XRD to exam samples of the fine powders, the resulted diffraction pattern (marked as M1) is shown in FIG. 4, plotted as the diffraction intensity versus 2θ (θ is X-ray incident angle) values across a range from 10 degrees to 80 degrees. As shown, the plot yields many sharp peaks at certain 2θ values corresponding to characteristic peaks specific for crystal compounds $PbTeO_3$, indicating that the corrosion binder in powered form obtained via above preparation method shows a substantially $PbTeO_3$ crystalline characteristic.

Figure 5:
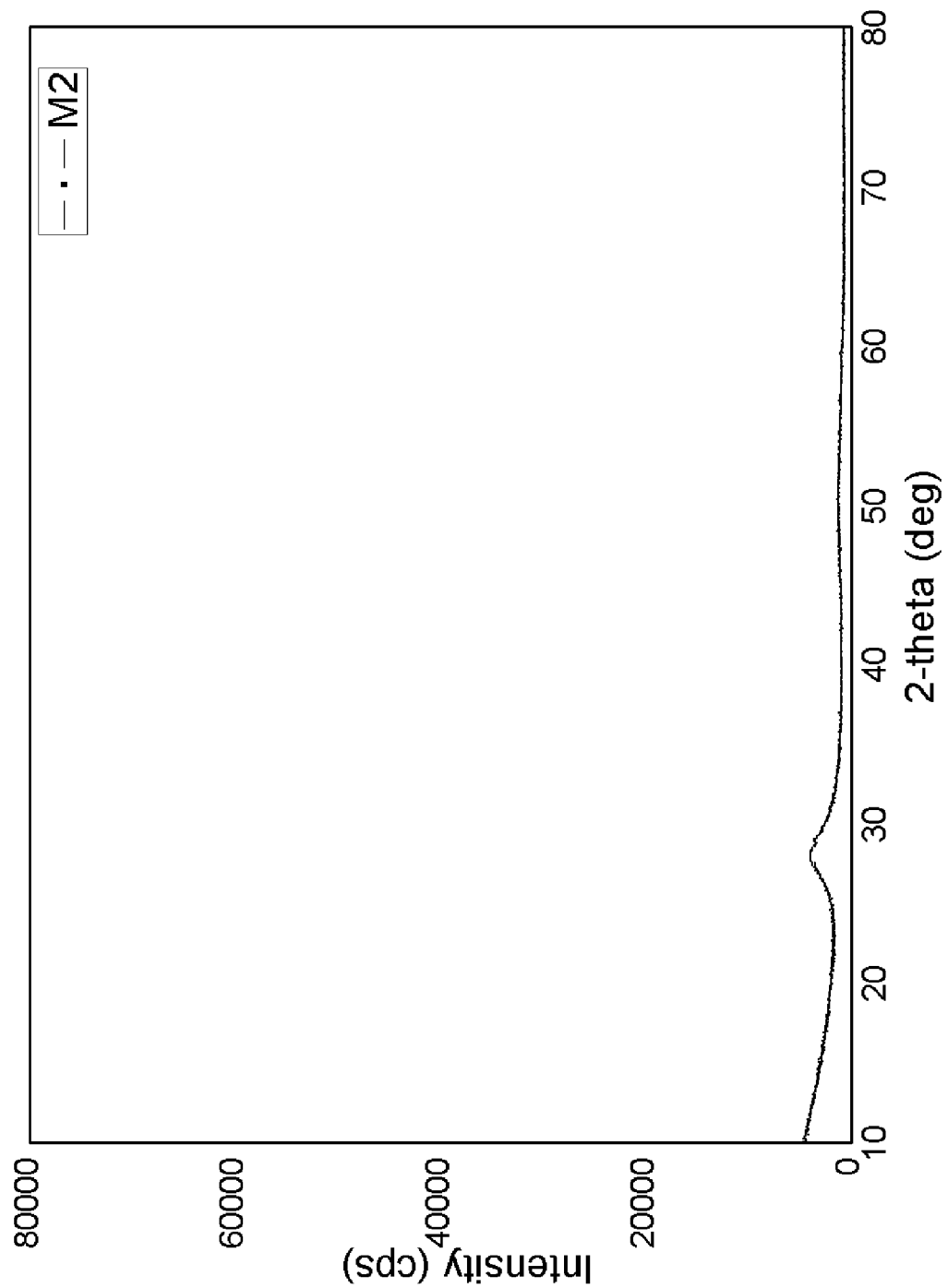
FIG. 5 an exemplary diagram of XRD measured from a glass frit, as another ingredient in the electrically conductive paste, showing no crystalline characteristics according to a specific embodiment of the present invention.

In another example, same chemical compounds $TeO_2$ and PbO in powders are mixed with the same mole ratio of 1:1. The powder mixture is placed in a crucible and heated in air atmosphere to form a melt. Then the melt is cooled quickly by a quenching method. In an implementation, the melt is quenched by pouring the melt directly on a stainless steel platen or using metal roller to obtain a bulk platelet according to methods presented in U.S. patent Ser. No. 13/100,550 and other related references. In another implementation, the melt is quenched by pouring into deionized water to form a bulk material. The bulk platelet material is crunched by grinding into small particles which are further ball-milled into fine powders having $D_{50}$ sizes of 0.1~5 microns. Using XRD to exam samples of the fine powders, the resulted diffraction pattern (marked as M2) is shown in FIG. 5. As shown, the plotted diffraction intensity versus 2θ (θ is X-ray incident angle) values across a range from 10 degrees to 80 degrees yield a wide range of low intensity curve with only a small bump near the small angular regions. This is a clear indication that no crystalline structure exists in these fine powders, instead, the powders obtained by following conventional preparation method is predominantly glass material with an amorphous structure.

In the above-mentioned two examples, although the use of the same composition and proportion of $TeO_2$ and PbO oxide powder material, different preparation process yields different material with different atomic structure and physical property. A method according to the present invention leads to powders of Pb—Te—O-based crystalline particles while another method following prior art references yields only powders of glass particles. Consequently, the obtained different powders behave differently in their physical state transformation during a sintering/firing process in associated with the application of the conductive paste. Specifically, as temperature increases during the sintering/firing process the particles with crystalline structure added as additive in the conductive paste go through a direct physical phase transition from a solid phase to a liquid phase while the particles with glass structure in the same conductive paste go through a phase transition from a solid state to a glass-softening state before finally transforming into a liquid state.

In a specific embodiment, the crystal-based corrosion binder is controlled in a weight composition range from 0.1 wt % to 15 wt % based on total weight of conductive paste formed for the formation of front electrode on top of a PN junction of a crystalline silicon solar cell. If the amount of crystal-based corrosion binder is greater than 15 wt %, the conductive paste may burn through the PN junction, causing a short circuit. If the crystal-based corrosion binder is less than 0.1 parts by weight, it may be difficult to completely remove an antireflective layer between the conductive paste and the semiconductor PN junction, resulting in the performance deterioration of the crystalline silicon solar cell. Therefore, the amount of the crystal-based corrosion binder used in the conductive paste is controlled between 0.1 to 15 parts by weight, such as 1 part by weight, 5 parts by weight, 10 parts by weight and 12 parts by weight.

Glass Frit combined with Corrosion Binder

In one or more embodiments, the present invention provides a conductive paste includes a glass frit having a relative high glass softening zone ranged from 500 to 650° C. combined with the Pb—Te—O-based crystalline corrosion binder with a melting point within 440-760° C. as additives with metal powders and organic carrier. The combined weight of the crystalline corrosion binder and the glass frit is of 1% to 15% of a total weight of the conductive paste. The weight ratio among the crystalline corrosion binder and the glass frit combination may be a 5/95-95/5.

According to embodiments of the present invention, the glass frit material combined with corrosion binder for preparation of the conductive paste comprises a lead-based glass frit and a lead-free glass frit. The lead-based glass frit includes Pb—Si—Al—B—O, Pb—Te—B—O, Pb—Te—O, and Pb—Te—Li—O glass material. The lead-free glass frit includes Bi—Si—B—Zn—O, Zn—B—P—Li—O, B—Al—Li—O, Na—Al—B—O, and Bi—V—Ba—P—O glass material.

In a specific embodiment, the Pb—Si—Al—B—O glass frit is formed from lead oxide, silicon oxide, aluminum oxide, and boron oxide mixing in proportion and heated to a molten state. Then the molten mixture is quenched followed by a grinding process to obtain the glass frit in powdered form. The glass frit is not a crystalline structure and is characterized by a softening temperature zone from 500° C. to 650° C. In an example, the combined weight of the Pb—Si—Al—B—O glass frit and the crystalline corrosion binder is about 1% to 15% of a total weight of the conductive paste. The weight ratio among the crystalline corrosion binder and the glass frit combination may be a 5/95-95/5. The crystalline corrosion binder is at least one or a mixture of two or more following crystal compounds: $PbTe_4O_9$, $PbTeO_3.0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{1.5}O_7$, $Pb_5TeO_7$, $Pb_5TeO_7$, $Pb_6Te_5O_{18}.5H_2O$, $PbTe_4O_9$, $PbTe_2O_5$, $PbH_4TeO_6$, $PbTeCO_5$, and $Pb_3TeN_2O_8$, have a fixed melting temperature falling in the range of 440° C. to 760° C. During an application of the conductive paste on the formation of electrodes of silicon solar cell, the crystalline corrosion binder quickly turns its crystal solid state into a molten state as the temperature reaches the melting point. Assisted by the Pb—Si—Al—B—O glass frit, the molten state corrosion binder can effectively etch and penetrate an antireflection layer on the front surface of the silicon solar cell and cause a formation of good ohmic contact between the metal material in the conductive paste and the semiconductor solar cell. The combination of softened glass frit and the molten corrosion binder also effectively wet the metal powders for facilitating their sintering into conductive bulk to form a solar cell front electrode with excellent electrical conductance performance.

In another specific embodiment, the Pb—Te—O glass frit is formed from lead oxide and tellurium oxide mixing in proportion and heated to a molten state. Then the molten mixture is quenched followed by a grinding process to obtain the glass frit in powdered form. The glass frit is not a crystalline structure and is characterized by a softening temperature zone from 500° C. to 650° C. In an example, the combined weight of the Pb—Te—O glass frit and the crystalline corrosion binder is about 1% to 15% of a total weight of the conductive paste. The weight ratio among the crystalline corrosion binder and the glass frit combination may be a 5/95-95/5. The crystalline corrosion binder is at least one or a mixture of two or more following crystal compounds: $PbTe_4O_9$, $PbTeO_3.0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{1.5}O_7$, $Pb_5TeO_7$, $Pb_5TeO_7$, $Pb_6Te_5O_{18}.5H_2O$, $PbTe_4O_9$, $PbTe_2O_5$, $PbH_4TeO_6$, $PbTeCO_5$, and $Pb_3TeN_2O_8$, have a fixed melting temperature falling in the range of 440° C. to 760° C. During an application of the conductive paste on the formation of electrodes of silicon solar cell, the crystalline corrosion binder quickly turns its crystal solid state into a molten state as the temperature reaches the melting point. Assisted by the Pb—Te—O glass frit, the molten state corrosion binder can effectively etch and penetrate an antireflection layer on the front surface of the silicon solar cell and cause a formation of good ohmic contact between the metal material in the conductive paste and the semiconductor solar cell. The combination of softened glass frit and the molten corrosion binder also effectively wet the metal powders for facilitating their sintering into conductive bulk to form a solar cell front electrode with excellent electrical conductance performance.

In yet another specific embodiment, the Pb—Te—B—O glass frit is formed from lead oxide, tellurium oxide, and boron oxide mixing in proportion and heated to a molten state. Then the molten mixture is quenched followed by a grinding process to obtain the glass frit in powdered form. The glass frit is not a crystalline structure and is characterized by a softening temperature zone from 500° C. to 650° C. In an example, the combined weight of the Pb—Te—B—O glass frit and the crystalline corrosion binder is about 1% to 15% of a total weight of the conductive paste. The weight ratio among the crystalline corrosion binder and the glass frit combination may be a 5/95-95/5. The crystalline corrosion binder is at least one or a mixture of two or more following crystal compounds: $PbTe_4O_9$, $PbTeO_3.0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{1.5}O_7$, $Pb_5TeO_7$, $Pb_5TeO_7$, $Pb_6Te_5O_{18}.5H_2O$, $PbTe_4O_9$, $PbTe_2O_5$, $PbH_4TeO_6$, $PbTeCO_5$, and $Pb_3TeN_2O_8$, have a fixed melting temperature falling in the range of 440° C. to 760° C. During an application of the conductive paste on the formation of electrodes of silicon solar cell, the crystalline corrosion binder quickly turns its crystal solid state into a molten state as the temperature reaches the melting point. Assisted by the Pb—Te—B—O glass frit, the molten state corrosion binder can effectively etch and penetrate an antireflection layer on the front surface of the silicon solar cell and cause a formation of good ohmic contact between the metal material in the conductive paste and the semiconductor solar cell. The combination of softened glass frit and the molten corrosion binder also effectively wet the metal powders for facilitating their sintering into conductive bulk to form a solar cell front electrode with excellent electrical conductance performance.

In still another specific embodiment, the Pb—Te—Li—O glass frit is formed from lead oxide, tellurium oxide, and lithium oxide mixing in proportion and heated to a molten state. Then the molten mixture is quenched followed by a grinding process to obtain the glass frit in powdered form. The glass frit is not a crystalline structure and is characterized by a softening temperature zone from 500° C. to 650° C. In an example, the combined weight of the Pb—Te—Li—O glass frit and the crystalline corrosion binder is about 1% to 15% of a total weight of the conductive paste. The weight ratio among the crystalline corrosion binder and the glass frit combination may be a 5/95-95/5. The crystalline corrosion binder is at least one or a mixture of two or more following crystal compounds: $PbTe_4O_9$, $PbTeO_3.0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{1.5}O_7$, $Pb_5TeO_7$, $Pb_5TeO_7$, $Pb_6Te_5O_{18}.5H_2O$, $PbTe_4O_9$, $PbTe_2O_5$, $PbH_4TeO_6$, $PbTeCO_5$, and $Pb_3TeN_2O_8$, have a fixed melting temperature falling in the range of 440° C. to 760° C. During an application of the conductive paste on the formation of electrodes of silicon solar cell, the crystalline corrosion binder quickly turns its crystal solid state into a molten state as the temperature reaches the melting point. Assisted by the Pb—Te—Li—O glass frit, the molten state corrosion binder can effectively etch and penetrate an antireflection layer on the front surface of the silicon solar cell and cause a formation of good ohmic contact between the metal material in the conductive paste and the semiconductor solar cell. The combination of softened glass frit and the molten corrosion binder also effectively wet the metal powders for facilitating their sintering into conductive bulk to form a solar cell front electrode with excellent electrical conductance performance.

In yet still another specific embodiment, the Bi—Si—B—Zn—O glass frit is formed from bismuth oxide, silicon oxide, boron oxide, and zinc oxide mixing in proportion and heated to a molten state. Then the molten mixture is quenched followed by a grinding process to obtain the glass frit in powdered form. The glass frit is not a crystalline structure and is characterized by a softening temperature zone from 500° C. to 650° C. In an example, the combined weight of the Bi—Si—B—Zn—O glass frit and the crystalline corrosion binder is about 1% to 15% of a total weight of the conductive paste. The weight ratio among the crystalline corrosion binder and the glass frit combination may be a 5/95-95/5. The crystalline corrosion binder is at least one or a mixture of two or more following crystal compounds: $PbTe_4O_9$, $PbTeO_3.0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{1.5}O_7$, $Pb_5TeO_7$, $Pb_5TeO_7$, $Pb_6Te_5O_{18}.5H_2O$, $PbTe_4O_9$, $PbTe_2O_5$, $PbH_4TeO_6$, $PbTeCO_5$, and $Pb_3TeN_2O_8$, have a fixed melting temperature falling in the range of 440° C. to 760° C. During an application of the conductive paste on the formation of electrodes of silicon solar cell, the crystalline corrosion binder quickly turns its crystal solid state into a molten state as the temperature reaches the melting point. Assisted by the Bi—Si—B—Zn—O glass frit, the molten state corrosion binder can effectively etch and penetrate an antireflection layer on the front surface of the silicon solar cell and cause a formation of good ohmic contact between the metal material in the conductive paste and the semiconductor solar cell. The combination of softened glass frit and the molten corrosion binder also effectively wet the metal powders for facilitating their sintering into conductive bulk to form a solar cell front electrode with excellent electrical conductance performance.

In an alternative embodiment, the Zn—B—P—Li—O glass frit is formed from zinc oxide, boron oxide, phosphorus oxide, and lithium oxide mixing in proportion and heated to a molten state. Then the molten mixture is quenched followed by a grinding process to obtain the glass frit in powdered form. The glass frit is not a crystalline structure and is characterized by a softening temperature zone from 500° C. to 650° C. In an example, the combined weight of the Zn—B—P—Li—O glass frit and the crystalline corrosion binder is about 1% to 15% of a total weight of the conductive paste. The weight ratio among the crystalline corrosion binder and the glass frit combination may be a 5/95-95/5. The crystalline corrosion binder is at least one or a mixture of two or more following crystal compounds: $PbTe_4O_9$, $PbTeO_3.0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{1.5}O_7$, $Pb_5TeO_7$, $Pb_5TeO_7$, $Pb_6Te_5O_{18}.5H_2O$, $PbTe_4O_9$, $PbTe_2O_5$, $PbH_4TeO_6$, $PbTeCO_5$, and $Pb_3TeN_2O_8$, have a fixed melting temperature falling in the range of 440° C. to 760° C. During an application of the conductive paste on the formation of electrodes of silicon solar cell, the crystalline corrosion binder quickly turns its crystal solid state into a molten state as the temperature reaches the melting point. Assisted by the Zn—B—P—Li—O glass frit, the molten state corrosion binder can effectively etch and penetrate an antireflection layer on the front surface of the silicon solar cell and cause a formation of good ohmic contact between the metal material in the conductive paste and the semiconductor solar cell. The combination of softened glass frit and the molten corrosion binder also effectively wet the metal powders for facilitating their sintering into conductive bulk to form a solar cell front electrode with excellent electrical conductance performance.

In another alternative embodiment, the B—Al—Li—O glass frit is formed from boron oxide, aluminum oxide, and lithium oxide mixing in proportion and heated to a molten state. Then the molten mixture is quenched followed by a grinding process to obtain the glass frit in powdered form. The glass frit is not a crystalline structure and is characterized by a softening temperature zone from 500° C. to 650° C. In an example, the combined weight of the B—Al—Li—O glass frit and the crystalline corrosion binder is about 1% to 15% of a total weight of the conductive paste. The weight ratio among the crystalline corrosion binder and the glass frit combination may be a 5/95-95/5. The crystalline corrosion binder is at least one or a mixture of two or more following crystal compounds: $PbTe_4O_9$, $PbTeO_3.0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{1.5}O_7$, $Pb_5TeO_7$, $Pb_5TeO_7$, $Pb_6Te_5O_{18}.5H_2O$, $PbTe_4O_9$, $PbTe_2O_5$, $PbH_4TeO_6$, $PbTeCO_5$, and $Pb_3TeN_2O_8$, have a fixed melting temperature falling in the range of 440° C. to 760° C. During an application of the conductive paste on the formation of electrodes of silicon solar cell, the crystalline corrosion binder quickly turns its crystal solid state into a molten state as the temperature reaches the melting point. Assisted by the B—Al—Li—O glass frit, the molten state corrosion binder can effectively etch and penetrate an antireflection layer on the front surface of the silicon solar cell and cause a formation of good ohmic contact between the metal material in the conductive paste and the semiconductor solar cell. The combination of softened glass frit and the molten corrosion binder also effectively wet the metal powders for facilitating their sintering into conductive bulk to form a solar cell front electrode with excellent electrical conductance performance.

In yet another alternative embodiment, the Na—Al—B—O glass frit is formed from sodium oxide, aluminum oxide, and boron oxide mixing in proportion and heated to a molten state. Then the molten mixture is quenched followed by a grinding process to obtain the glass frit in powdered form. The glass frit is not a crystalline structure and is characterized by a softening temperature zone from 500° C. to 650° C. In an example, the combined weight of the Na—Al—B—O glass frit and the crystalline corrosion binder is about 1% to 15% of a total weight of the conductive paste. The weight ratio among the crystalline corrosion binder and the glass frit combination may be a 5/95-95/5. The crystalline corrosion binder is at least one or a mixture of two or more following crystal compounds: $PbTe_4O_9$, $PbTeO_3.0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{1.5}O_7$, $Pb_5TeO_7$, $Pb_5TeO_7$, $Pb_6Te_5O_{18}.5H_2O$, $PbTe_4O_9$, $PbTe_2O_5$, $PbH_4TeO_6$, $PbTeCO_5$, and $Pb_3TeN_2O_8$, have a fixed melting temperature falling in the range of 440° C. to 760° C. During an application of the conductive paste on the formation of electrodes of silicon solar cell, the crystalline corrosion binder quickly turns its crystal solid state into a molten state as the temperature reaches the melting point. Assisted by the Na—Al—B—O glass frit, the molten state corrosion binder can effectively etch and penetrate an antireflection layer on the front surface of the silicon solar cell and cause a formation of good ohmic contact between the metal material in the conductive paste and the semiconductor solar cell. The combination of softened glass frit and the molten corrosion binder also effectively wet the metal powders for facilitating their sintering into conductive bulk to form a solar cell front electrode with excellent electrical conductance performance.

In still another alternative embodiment, the Bi—V—Ba—P—O glass frit is formed from bismuth oxide, vanadium oxide, barium oxide, and phosphorus oxide mixing in proportion and heated to a molten state. Then the molten mixture is quenched followed by a grinding process to obtain the glass frit in powdered form. The glass frit is not a crystalline structure and is characterized by a softening temperature zone from 500° C. to 650° C. In an example, the combined weight of the Bi—V—Ba—P—O glass frit and the crystalline corrosion binder is about 1% to 15% of a total weight of the conductive paste. The weight ratio among the crystalline corrosion binder and the glass frit combination may be a 5/95-95/5. The crystalline corrosion binder is at least one or a mixture of two or more following crystal compounds: $PbTe_4O_9$, $PbTeO_3.0.33H_2O$, $PbTeO_3$, $PbTeO_4$, $Pb_3TeO_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{L5}O_7$, $Pb_5TeO_7$, $Pb_5TeO_7$, $Pb_6Te_5O_{18}.5H_2O$, $PbTe_4O_9$, $PbTe_2O_5$, $PbH_4TeO_6$, $PbTeCO_5$, and $Pb_3TeN_2O_8$, have a fixed melting temperature falling in the range of 440° C. to 760° C. During an application of the conductive paste on the formation of electrodes of silicon solar cell, the crystalline corrosion binder quickly turns its crystal solid state into a molten state as the temperature reaches the melting point. Assisted by the Bi—V—Ba—P—O glass frit, the molten state corrosion binder can effectively etch and penetrate an antireflection layer on the front surface of the silicon solar cell and cause a formation of good ohmic contact between the metal material in the conductive paste and the semiconductor solar cell. The combination of softened glass frit and the molten corrosion binder also effectively wet the metal powders for facilitating their sintering into conductive bulk to form a solar cell front electrode with excellent electrical conductance performance.

Since both the Pb—Te—O-based crystalline corrosion binder and a glass frit made from similar raw oxide materials are mixed into the conductive paste according to one or more embodiments of the present invention, it is better to point out their individual roles played during the application of the conductive paste. When applying a sintering process to transform the conductive paste to a metallic electrode on semiconductor device, both types of additives experiences different physical state transition thereby causing different chemical/physical effects in the process and different end-results that are not anticipated from prior art references. Before the temperature increases to a value close to the melting point of the crystalline corrosion binder, the corrosion binder is embedded in the paste as solid particles dispersed from the metal powder particles, leaving gaps between particles to allow the organic carrier to release with the increasing temperature. Since glass frit in the conductive paste has a reduced proportion and a raised softening zone, the potential effect of clogging of those gaps between the solid particles by premature glass softening, as maybe seen with convention paste in use, is suppressed to avoid problems related to incomplete releasing of organic carrier. As the temperature reaches the melting point of the Pb—Te—O-based crystal, the corrosion binder particles change their physical form from a solid state to liquid phase almost instantly. It has very low viscosity and can quickly flow through the gap between the metal particles into a bottom surface where the paste is in contact with an insulation layer overlying the semiconductor device. Because of the low viscosity of the Pb—Te—O-based crystal melt, the liquid phase corrosion binder easily spread to reach entire insulation layer within the bottom surface to cause an etching reaction of the corresponding insulation layer for substantially remove entire insulation layer and form metal-semiconductor interface regions with increased conductive contact and enhanced tunnel effect. Consequently, a metal-semiconductor contact with low contact resistance is formed. This process also occurs in a shorter cycle than that with a conventional paste without adding crystal-based corrosion binder and total amount of Pb—Te—O material added in the conductive paste in order for sufficiently removing the insulation layer is also reduced. In addition, the glass frit retained with reduced amount in the present invention has relative high softening temperatures so that premature glass softening in the sintering process is greatly suppressed to prevent blocking the discharge of organic components. At the same time, the softened glass material still effectively aid sintering of metal powders into a bulk metal with enhanced compactness and increased weldability. Using crystalline silicon solar cell as an example, as the results of applying the conductive paste including crystalline corrosion binder combined with a reduced amount of glass frit, performance of the solar cell is substantially improved in terms of the open-circuit voltage, the short-circuit current, the series resistance, the fill factor, and the photoelectric conversion efficiency.

Metallic Powder

In the conductive paste for forming electrode of semiconductor device, metallic powder is one major component designated as electrical conductive medium of the electrode. In an embodiment, the metallic powder is made from materials having melting temperatures at least above 350° C. In a preferred embodiment, the melting temperature of the metallic powder is above 600° C. If its melting point is too low, during the sintering process, a premature melting of the metallic powders occurs to hinder the discharge of the organic carrier. Additionally, the premature melting produces significant sideward flows reducing height aspect ratio of the electrode lines across the semiconductor device. Of course, if its melting point is too high, e.g., above 2000° C., it is difficult to carry an effective sintering process to complete transform the powder form into bulk material so that the as-formed electrode contains many metallic blocks with bulk-sized voids, resulting in a large passage resistance and deterioration of device performance.

In a specific embodiment, the metallic powder is at least one material selected from the group consisting of silver, gold, platinum, palladium, and rhodium, or an alloy material containing either silver, gold, platinum, palladium or rhodium doped with at least one metal of copper, iron, nickel, zinc, titanium, cobalt, chromium, and manganese, such as manganese copper, constantan, nickel-chromium alloy. The metallic powder is made as a plurality of small particles from grinding of bulk metal material and further ball-milling into substantially round shaped fine powders.

In another specific embodiment, the metallic powder is a plurality of silver-coated metal particles wherein the metal is at least one selected from copper, iron, nickel, zinc, titanium, cobalt, chromium, manganese, copper, iron, nickel, zinc, and titanium. The silver coating is formed by either electroless Ag plating or electroplating methods or vapor deposition In an embodiment, the silver coating method includes the following process: 1) placing metal particles with diameters 0.1-5.0 μm of copper, iron, nickel, titanium, cobalt, chromium, zinc, or manganese, or an alloy thereof in a dilute weak acid and soaking for 10-300 seconds to strip out any surface oxide layer; 2) washing with deionized water repeatedly to remove residual acid; 3) electroless Ag on the metal paticles in a solution comprising: 2.4~14.2 g/L $AgNO_3$, 0.8 g/L $NH_3$, 1~3 g/L HCHO, and 1~4 g/L $N_2H_4.H_2O$, 1.0 g/L. The PH of the solution is between 10 and 11, the temperature is between 55-65° C., stirring rate is 1000 r/min. In another embodiment, the silver coating method includes the following process: 1) placing metal particles with diameters 0.1-5.0 μm of copper, iron, nickel, titanium, cobalt, chromium, zinc, or manganese, or an alloy thereof in a dilute weak acid and soaking for 10-300 seconds to strip out any surface oxide layer; 2) washing with deionized water repeatedly to remove residual acid;

3) drying the wet powder in a vacuum oven of <10$^{-3}$ pA with the drying temperature set below the melting point of the metal; 4) disposing dried particles free of surface oxide layer in an evaporation equipment to ensure effective dispersion between particles. 5) vaporizing a silver target by resistance heating, electron beam or laser beam heating, controlling the heating power, the deposition time and other process conditions to form silver coating over the metal particles. The method results in the silver-coated metal particles of copper, iron, nickel, titanium, cobalt, chromium, zinc, or manganese, or an alloy thereof. The thickness of the silver coating is related to the process time and other plating parameters. The silver coating preferably is controlled within a thickness range of 1~10$^4$ nm, and more preferably is 10 to 10$^2$ nm. If the thickness of the silver coat layer is less than 1 nm, silver content is too small and contact resistance of the electrode or the drain current will be significantly increased. If the thickness of the silver coating layer is more than 10$^4$ nm, it will make the particle diameter of the conductive metal powder too large and also increase manufacturing cost of the metallic powder and subsequently the semiconductor device. Of course, silver coating can be replaced by coating of gold or platinum.

In yet another specific embodiment, the particle sizes of the metallic powders are selected to be able to meet the paste printing requirements, e.g., the size should not clog the printing stencil. Preferably, the particle size distribution of the metallic powder is ranged from 0.1 to 5.0 µm. If the size is more than 5.0 µm, it is likely to cause clogging of printing stencil and correspondingly the electrode disconnection. If the size is less than 0.1 µm, the viscosity of the paste will substantially increase, making it difficult for normal printing. Additionally, when the conductive paste is used for making electrode on solar cell, the well selected particle sizes in the metallic powders can effectively reduce contact area of the front electrode and allow more area for active solar conversion, resulting in higher solar cell conversion efficiency. At the same time, the smaller electrode has less height due to enhance conductivity so as to save cost by saving the expensive materials.

Organic Carrier

The organic carrier in the conductive paste for the formation of electrode on semiconductor device includes organic solvent, organic binder, wetting dispersant reagents, thixotropic agents and other functional additives. In an embodiment, based on 100 parts by weight of the organic carrier, the organic solvent constitutes 50 to 95 parts by weight; organic binder accounts for 1 to 40 parts by weight; wetting dispersant reagents accounts for 0.1 to 10 parts by weight; thixotropic agents and other functional additives comprises 1 to 20 parts by weight. In particular, optimum amount of the organic solvent within the organic carrier should be greater than 50 wt % to prevent viscosity of the paste becoming too large to affect screen printing quality. But if the organic solvent amount is over 95 wt %, the paste formed by such organic carrier may lack of bonding phase so that when the paste is printed on a semiconductor surface there will be incomplete printed pattern. The paste may have poor adhesion characteristic to cause easy separation between the organic carrier and the metallic powder or glass powder therein. Similarly, the organic binder composition is also optimized to provide good quality of bonding the powders in the paste while having proper viscosity for easy printing.

In a specific embodiment, the organic solvent can be at least one with a medium or high boiling temperature such as alcohol (e.g., terpineol, butyl carbitol), alcohol ester (e.g., Alcohol ester-12), terpene and others. Suitable organic binder includes ethyl cellulose, polymethacrylate, alkyd resin, and derivatives thereof. The wetting dispersant reagent helps to disperse inorganic powders in the organic carrier. The thixotropic agent is used to increase the thixotropy of the conductive paste in the printing process to ensure the resolution of electrode pattern and better aspect ratio. Suitable thixotropic agent includes an organic thixotropic agent selected from hydrogenated castor oil derivatives or polyamide wax, etc. Other organic functional agents may be added, such as microcrystalline wax may be added for reducing the surface tension, DBP is added for improving the flexibility of the paste, and PVB is added for improving the adhesion.

Preparation Method of the Conductive Paste

Figure 6:
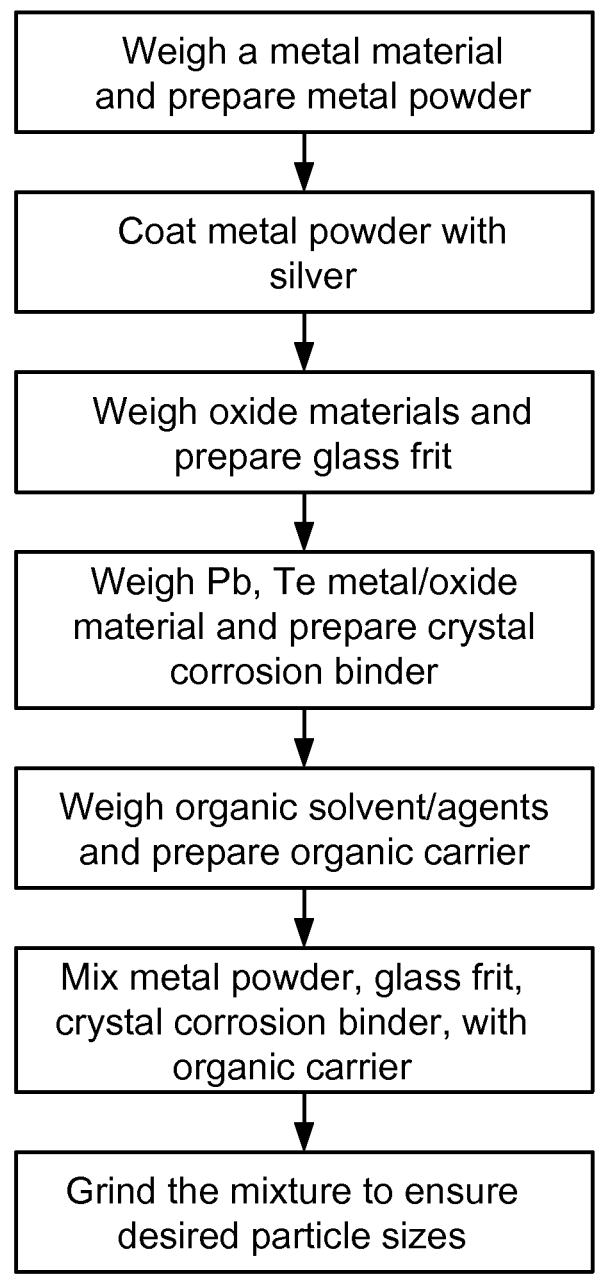
FIG. 6 is a chart diagram showing a method for forming an electrically conductive paste according to an embodiment of the present invention.

FIG. 6 is a chart diagram showing a method for forming an electrically conductive paste according to one or more embodiments of the present invention. The method includes providing a certain amount of each component based on a total weight including a metallic powder, a glass frit, a corrosion binder, and an organic carrier. In an embodiment, the corrosion binder and the glass frit can be supplied with a combined weight composition and a corresponding weight ratio between themselves. The method further includes individual processes for preparing each type of component respectively to a desired physical form in terms of particle sizes and viscosity control. Additionally, the method includes mixing all individually prepared components within desired composition ranges to form the substantially uniform mixture material. Moreover, the method includes finally grinding the mixture material to ensure all particles therein with desired sizes and dispersions. Several embodiments are disclosed below.

In an embodiment, after weighing the corrosion binder and glass frit, they are uniformly mixed with an organic carrier. Then a metal powder is weighed and mixed in before a final grinding to ensure a desired particle size range.

In another embodiment, the weighed metal powder and organic vehicle are uniformly mixed before further adding a weighed corrosion binder and a glass frit. A final grinding is applied to ensure a desired particle size range.

In yet another embodiment, after mixing the weighed metal powder, glass frit and corrosion binder to a solid mixture. An organic carrier is added to the solid mixture before a final grinding process to ensure a desired particle size range.

In still another embodiment, the weighed metal powder, corrosion binder, glass frit and an organic vehicle are mixed. Then the mixture is milled further to ensure a desired particle size range.

The final grinding process mentioned above is part of the mixing processing to form the conductive paste with desired property. The process can be performed using a three-roll mill. Of course, other grinding apparatus can also be used. After grinding, the particle sizes of the crystalline corrosion binder and the metal powder are controlled in a desired range for facilitating paste screen print and effectiveness in a process for forming an electrode on semiconductor surface. In an example, all particle sizes are controlled substantially within a range from 0.1 to 5.0 µm.

In one or more embodiments, the method for forming an electrically conductive paste provides one or more processes for preparing a metallic powder. In an embodiment, the metallic powder is made from at least one metal material selected from silver, gold, platinum, copper, iron, nickel, zinc, titanium, cobalt, chromium, manganese, palladium, and rhodium or a metal alloy of two or more of them. In another embodiment, the metallic powder includes a plurality of metal particles made by one metal material selected from copper, iron, nickel, zinc, titanium, cobalt, chromium, and manganese or a metal alloy of two or more of them, and at least 5% or more partially coated by a thickness of silver layer in a range of 1~2000 nm. The silver coating can be performed using electroless plating or electroplate technique. Each metal particle can have its size being limited to certain desired level by controlling one or more grinding or milling process. In yet another embodiment, the metallic powder includes a first plurality of silver particles mixed with a second plurality of silver-coated nickel particles with a weight composition ratio between the first plurality of silver particles and the second plurality of silver-coated nickel particles in a range from 5:95 to 95:5 per any fixed amount of the metallic powder.

Figure 7:
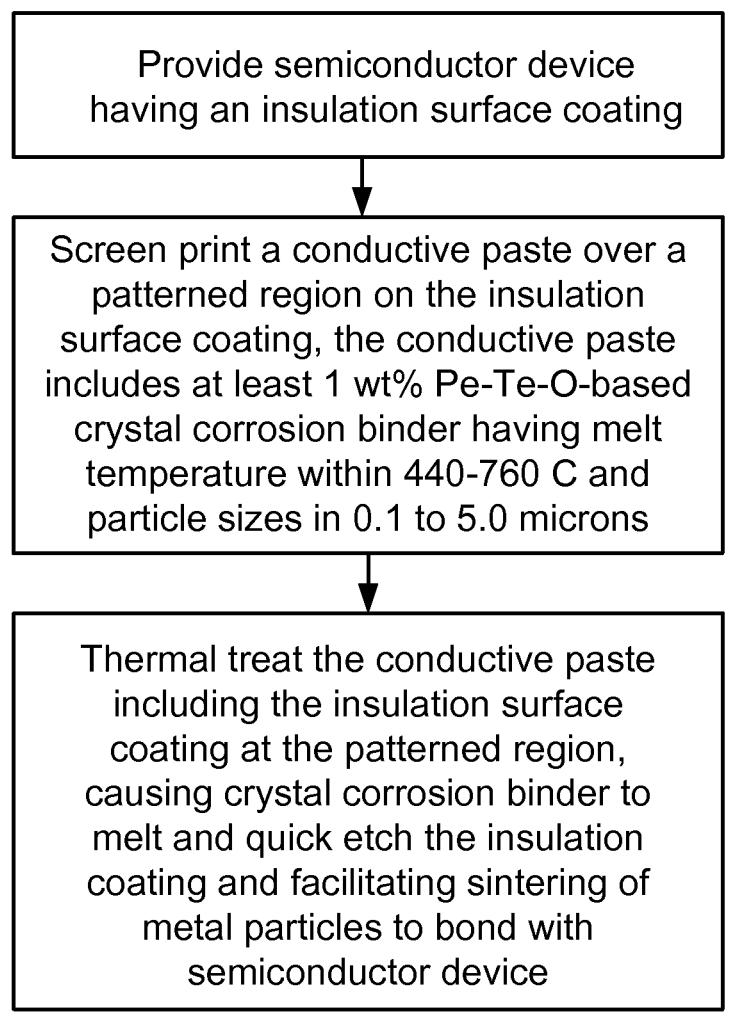
FIG. 7 is a chart diagram showing a method for forming an electrode on semiconductor device surface from an electrically conductive paste according to an alternative embodiment of the present invention.

In an alternative embodiment, the present invention provides a method for making an electrode on a semiconductor surface from an electrically conductive paste provided in the same invention. FIG. 7 shows a chart diagram illustrating the method for making an electrode on a semiconductor surface from an electrically conductive paste. As shown, the method includes providing a semiconductor device having an insulation surface coating. Additionally, the method includes printing a conductive paste material overlying a patterned region of the insulation surface coating on the semiconductor device. This can be referred to FIG. 1 where a sectional view of a conductive paste being applied overlying an insulation layer overlying a semiconductor device. The conductive paste material printed in the method is substantially the one provided in one or more embodiments shown in FIG. 6 and described in corresponding specifications above. In particular, the conductive paste material includes a plurality of metal particles with a weight composition ranging from 70 to 93 wt % based on a given total weight of the conductive paste material. Furthermore, the conductive paste material includes a corrosion binder made from a plurality of Pb—Te—O-based crystalline particles and a glass frit made from a plurality of glass particles with a combined weight composition ranging from 1 to 15 wt % based on the given total weight. Moreover, the conductive paste material includes an organic carrier with a weight composition ranging from 5 to 25 wt % based on the given total weight. The organic carrier dispersedly holds the plurality of metal particles, the plurality of Pb—Te—O-based crystalline particles, and the plurality of glass particles, wherein all particles have sizes in a range of 0.1 to 5.0 microns.

Referring to FIG. 7, the method for making an electrode on a semiconductor surface further includes a sintering process in which at least the conductive paste material and the patterned region in contact with the insulation surface coating is subjected to elevating temperatures up to about 900° C. In one or more embodiments, the elevating temperatures cause releasing of the organic carrier from the printed conductive paste through a plurality of intermediate regions between the dispersed particles, leaving corresponding intermediate regions as empty spaces or channels. As the sintering process temperature increases above the melting point of corresponding Pb—Te—O-based crystalline particles, which is at about 440° C. to 760° C., these crystal particles instantly melt into a liquid phase corrosion binder, starting to flow downward through the empty intermediate regions or channels to the patterned region between the applied conductive paste and the insulation surface coating. Along the way of flowing down, the liquid or molten corrosion binder also wets the plurality of metal particles at least partially. As the sintering process temperature rises into a stage over the softening temperatures (500° C. to 650° C.) associated with the glass frit made by the plurality glass particles proposed in the present invention, these glass particles become soften and also can wet the metal particle at least partially. As the temperature rises more, the plurality of metal particles are moved from dispersed positions to start sintering together to become a metallic bulk, assisted by wetting effects from the molten corrosion binder and soften glass frit. At the same time, the molten corrosion binder that reaches the insulation surface coating can induce an etching reaction with the coating material which is a redox reaction participated also by the nearby metal particles. The product of the etching reaction is precipitation of metal crystals and colloids at the expense of the insulation material (e.g., $SiN_x$ anti-reflective layer on emitter surface of a Si-based solar cell) in the surface coating. In a specific embodiment, the amount and weight composition of the corrosion binder and glass frit as well as their weight ratio provided according to the present invention substantially ensure a complete removal of the insulation surface coating to allow metal particles to form crystallized interface directly bonding with the semiconductor device as well as some metal colloids precipitation resulted from the redox reaction. The sintered metallic bulk forms an electrode having a good electrical contact with the semiconductor device.

Referring back to FIG. 2, as sintering process temperature increases from below 300° C., the organic carrier 128 first is released (or vaporized) through intermediate regions (see FIG. 1) between the dispersed particles (of the metal powder 122, glass frit 124, and corrosion binder 126), leaving behind a lots of void spacing. As the temperature reaches above 440° C. or higher, the crystal-based corrosion binder particles 126 start to melt. Depending on specific crystal compounds for making the corrosion binder, the melting temperature may be higher, up to 760° C. But whenever the temperature reaches the corresponding melting points, the corrosion binder 126 instantly melts into a liquid form 210 without any glass soften transition process. The liquid/molten corrosion binder 210 flows downward to reach the bottom region of the applied conductive paste 120. At the bottom region, the liquid corrosion binder 210 is in contact with the insulating layer 110 to induce an etching reaction. Since the corrosion binder is made of crystalline particles so that the above process occurs much faster than conventional paste with only glass frit material as etching additive, which must go through a much slower glass softening transition and become a relative low viscosity material at much higher temperature or later time. Therefore, the corresponding sintering process is accelerated in terms of delivering the corrosion binder towards the insulating layer 110 to start the etching reaction there.

At the same time, along the way of the liquid corrosion binder 210 flowing down, it also wets a plurality of metal particles 122 (see FIG. 1) while the metal particles 122 start to bond together becoming a bigger metallic bulk 220. During substantially the same time or subsequently later, the elevating sintering temperature may reach to a stage of the glass softening temperatures associated with the glass frit 124 in the conductive paste. For example, the glass softening temperatures are in a range of 500° C. to 650° C., for the glass frit made from Pb—Si—O, Bi—Si—O, Pb—B—O, Bi—B—O, Pb—Te—O, Bi—Te—O, P—Zn—Na—O, B—Al—Na—O, B—Zn—Ba—O, and V—P—Ba—O-based glass materials according to the present invention. The glass frits 124 become soft and gradually fuse into glass phases 230 and also wet (at least partially) nearby metal particles 122, which promotes sintering of the metal particles 122 together to form a metallic bulk 220 and at the same time help metal particles to transfer toward a reactive interface region where the etching reaction is induced by the liquid corrosion binder 210. The etching reaction is a redox reaction in which part of metal oxide within the metallic bulk 220 is dissolved into the liquid corrosion binder 210 and the glass phases 230. As the sintering temperature further rises beyond the glass softening temperature range (over 650° C. up to 900° C.), the glass phases 230 become substantially liquid state and also sink towards the interface between the paste and the insulation surface coating 110 to further assist the etching reaction. Now the insulation material 110 at the interface region is substantially dissolved to expose the semiconductor device 102 and form a ohmic contact layer 240. In the embodiment, the combined amount of the corrosion binder and glass frit within the applied conductive paste 120 should be controlled in an optimized range so that no over-etching effect occurs to cause unwanted etching into the semiconductor device 100.

Near the end of the sintering process, temperature falls back to the softening temperature range (between 500° C. and 650° C.) before further cooling, a plurality of metallic colloids precipitates in the mixture of liquid corrosion binder 210 and glass phases 230 near the just-formed metal crystal grains 220, forming the ohmic contact layer 240 which connects the metallic bulk 220 with the emitter 102 of the semiconductor device 100. In a specific embodiment, the electrical resistance between the metallic bulk 220 and the semiconductor device 100 contributes to the overall series resistance of the device. In the implementation of forming a front electrode of crystalline silicon solar cell, the lower the overall series resistance, the better in solar cell performance. In particular, the electrode line can be formed narrower and lower in height to enhance active area and reduce cost by saving expensive conductor material to provide cost-effective solar cell with higher photovoltaic conversion efficiency.

EXAMPLES

Illustrative preparations and evaluations of conductive paste compositions for the formation of front electrode of crystalline silicon-based solar cell are described below.

Example 1

The conductive paste for forming a front electrode of crystalline silicon-based solar cell includes, according to the total weight based on 100 parts, 85 wt % of metallic powder, 3 wt % of crystal corrosion binder, 2 wt % of glass frit, and 10 wt % of organic carrier. The crystal corrosion binder is substantially $PbTe_4O_9$ compound. The metallic powder is silver powder. The glass frit is made from Pb—Si—Al—B—O-based glass material containing 81 wt % of PbO, 16 wt % of $SiO_2$, 2 wt % of $Al_2O_3$, and 1 wt % of $B_2O_3$. The organic carrier includes 70 wt % of Terpineol organic solvent, 14 wt % of Ethyl Cellulose binder, 10 wt % of wetting and dispersing agent, 5.5 wt % of thixotropic agent, and 0.5 wt % of microcrystalline wax.

A method of preparation of the conductive paste for forming a front electrode of crystalline silicon-based solar cell includes:
1) Preparation of Corrosion Binder: Preparing a telluric acid solution having a concentration of 0.1 mol/L and heating to about 90° C.; mixing the telluric acid solution in proportion of molar ratio of 1:1 with a lead acetate solution having a concentration of 0.1 mol/L; heating the mixture solution to cause a chemical reaction to produce precipitate of $PbTe_4O_9$ compound; filtering to obtain the $PbTe_4O_9$ compound, and drying it for further usage.
2) Preparation of Metallic Powder: the metallic powder is silver powder having particle sizes less than 5.0 μm.
3) Preparation of Glass Frit: Mixing each corresponding component of the Pb—Si—Al—B—O-based glass material through a tapered blender; disposing the mixture into a container loaded in a muffle furnace; heating the mixture up to a peak temperature set to 1000° C. and maintain at the peak temperature for 60 minutes to completely melt the mixture into a uniform liquid; pouring the melt into a water-cooled quench system to obtain a glass material; grinding and milling the glass material into powders with particle sizes being controlled to be less than 5.0 μm.
4) Preparation of Conductive Paste: Selecting individually prepared glass frit, crystal corrosion binder, and organic carrier in weight compositions to mix uniformly; adding separately prepared metallic powder (silver powder) in corresponding weight composition with the above mixture and further mixing uniformly; milling the final mixture material through a three-roll mill to obtain the conductive paste with all particle sizes less than 5.0 μm.

Example 2

The conductive paste for forming a front electrode of crystalline silicon-based solar cell includes, according to the total weight based on 100 parts, 83 wt % of metallic powder, 4 wt % of crystal corrosion binder, 1.6 wt % of glass frit, and 11.4 wt % of organic carrier. The crystal corrosion binder is substantially $Pb_3TeO_5$ compound. The metallic powder is silver-coated nickel powder. The glass frit is made from Bi—Si—B—Zn—O-based glass material containing 70 wt % of $Bi_2O_3$, 15 wt % of $SiO_2$, 3 wt % of $B_2O_3$, 7 wt % of ZnO, and some other oxides including 3.5 wt % of BaO and 1.5 wt % of CuO. The organic carrier includes 50 wt % of Lauryl Alcohol Ester organic solvent, 40 wt % of Polymethacrylates binder, 5 wt % of wetting and dispersing agent, 4 wt % of thixotropic agent, and 0.5 wt % of DBP.

A method of preparation of the conductive paste for forming a front electrode of crystalline silicon-based solar cell includes:
1) Preparation of Corrosion Binder: Selecting PbO and $TeO_2$ with molar ratio of 3:1 ratio to form a mixture; vaporizing the mixture material to generate $Pb_3Te$ alloy vapor and introducing $Pb_3Te$ alloy vapor into a reaction chamber filled with oxygen at temperature of about 1300° C.; producing a crystalline powder of Pb—Te—O compound which is deposited at a bottom of the chamber; collecting the crystalline powder after natural cooling to obtain substantially $Pb_3TeO_5$ compound in powder form.
2) Preparation of Metallic Powder: the metallic powder is silver-coated nickel powder having particle sizes less than 5.0 μm.
3) Preparation of Glass Frit: Mixing each corresponding component of the Bi—Si—B—Zn—O-based glass material through a blade mixer; disposing the mixture into a container loaded in a muffle furnace; heating the mixture up to a peak temperature set to 1200° C. and maintain at the peak temperature for 60 minutes to completely melt the mixture into a uniform liquid; pouring the melt into a water-cooled quench system to obtain a glass material; grinding and milling the glass material into powders with particle sizes being controlled to be less than 5.0 μm.
4) Preparation of Conductive Paste: Selecting individually prepared silver-coated nickel powder and organic carrier in weight compositions to mix uniformly; adding separately prepared powder of glass frit and crystal corrosion binder in corresponding weight compositions with the above mixture and further mixing uniformly; milling the final mixture material through a three-roll mill to obtain the conductive paste with all particle sizes less than 5.0 μm.

Example 3

The conductive paste for forming a front electrode of crystalline silicon-based solar cell includes, according to the total weight based on 100 parts, 80 wt % of metallic powder, 6 wt % of crystal corrosion binder, 2.5 wt % of glass frit, and 11.5 wt % of organic carrier. The crystal corrosion binder is substantially $PbTeCO_5$ compound. The metallic powder is silver-coated copper powder. The glass frit is made from Zn—B—P—Li—O-based glass material containing 36 wt % of $B_2O_3$, 22 wt % of ZnO, 36 wt % of $P_2O_5$, 1 wt % of $Li_2O$, 4 wt % of MgO, and 1 wt % of $Mn_2O$. The organic carrier includes 65 wt % of Terpineol organic solvent, 20 wt % of Alkyd resin binder, 0.1 wt % of wetting and dispersing agent, 12.5 wt % of thixotropic agent, and 2.4 wt % of PVB.

A method of preparation of the conductive paste for forming a front electrode of crystalline silicon-based solar cell includes:
1) Preparation of Corrosion Binder: Selecting PbO and $TeO_2$ with molar ratio of 1:1 ratio to form a mixture; disposing the mixture material in a furnace with temperatures controlled between 700~900° C.; thermally inducing solid state reaction for ~1 hour to produce a crystalline Pb—Te—O compound; milling the crystalline Pb—Te—O compound after natural cooling to obtain substantially $PbTeO_3$ compound in powder form.
2) Preparation of Metallic Powder: the metallic powder is silver-coated copper powder having particle sizes less than 5.0 μm.
3) Preparation of Glass Frit: Mixing each corresponding component of the Zn—B—P—Li—O-based glass material through a gravity mixer; disposing the mixture into a container loaded in a muffle furnace; heating the mixture up to a peak temperature set to 900° C. and maintain at the peak temperature for 60 minutes to completely melt the mixture into a uniform liquid; pouring the melt into a water-cooled quench system to obtain a glass material; grinding and milling the glass material into powders with particle sizes being controlled to be less than 5.0 μm.
4) Preparation of Conductive Paste: Selecting individually prepared silver-coated copper powder, corrosion binder powder, and glass frit powder in weight compositions to mix uniformly; adding separately prepared organic carrier in corresponding weight composition with the above mixture and further mixing uniformly; milling the final mixture material through a three-roll mill to obtain the conductive paste with all particle sizes less than 5.0 μm.

Example 4

The conductive paste for forming a front electrode of crystalline silicon-based solar cell includes, according to the total weight based on 100 parts, 70 wt % of metallic powder, 2 wt % of crystal corrosion binder, 3 wt % of glass frit, and 25 wt % of organic carrier. The crystal corrosion binder is substantially $PbTeO_3$ compound. The metallic powder is silver-coated titanium powder. The glass frit is made from B—Al—Li—O-based glass material containing 56 wt % of $B_2O_3$, 35 wt % of $Al_2O_3$, 4 wt % of $Li_2O$, 4 wt % of MgO, and 5 wt % of $Na_2O$. The organic carrier includes 60 wt % of Amethocaine organic solvent, 15 wt % of Ethyl Cellulose binder, wt % of wetting and dispersing agent, 15 wt % of thixotropic agent, and 5 wt % of PVB.

A method of preparation of the conductive paste for forming a front electrode of crystalline silicon-based solar cell includes:
1) Preparation of Corrosion Binder: Selecting PbO and $TeO_2$ with molar ratio of 2:3 ratio to form a mixture; disposing the mixture material in a vacuum furnace at temperature ~900° C.; thermally inducing solid state reaction for ~1 hour to produce a crystalline Pb—Te—O compound; milling the crystalline Pb—Te—O compound after natural cooling to obtain substantially $Pb_2Te_3O_8$ compound in powder form.
2) Preparation of Metallic Powder: the metallic powder is silver-coated titanium powder having particle sizes less than 5.0 μm.
3) Preparation of Glass Frit: Mixing each corresponding component of the B—Al—Li—O-based glass material through a gravity mixer; disposing the mixture into a container loaded in a muffle furnace; heating the mixture up to a peak temperature set to 900° C. and maintain at the peak temperature for 60 minutes to completely melt the mixture into a uniform liquid; pouring the melt into a water-cooled quench system to obtain a glass material; grinding and milling the glass material into powders with particle sizes being controlled to be less than 5.0 μm.
4) Preparation of Conductive Paste: Selecting individually prepared silver-coated titanium powder, corrosion binder powder, and glass frit powder in weight compositions; mixing all above powder materials with separately prepared organic carrier in corresponding weight composition to form a uniform mixture; milling the mixture material through a three-roll mill to obtain the conductive paste with all particle sizes less than 5.0 μm.

Example 5

The conductive paste for forming a front electrode of crystalline silicon-based solar cell includes, according to the total weight based on 100 parts, 72 wt % of metallic powder, 15 wt % of crystal corrosion binder, 2.8 wt % of glass frit, and 10.2 wt % of organic carrier. The crystal corrosion binder is substantially $PbTeN_2O_8$ compound. The metallic powder is silver-coated cobalt powder. The glass frit is made from Na—Al—B—O-based glass material containing 8.4 wt % of $Na_2O$, 14.2 wt % of $Al_2O_3$, 72.4 wt % of $B_2O_3$, and 5 wt % of BaO. The organic carrier includes 70 wt % of Lauryl Alcohol Ester organic solvent, 15 wt % of Ethyl Cellulose binder, 2 wt % of wetting and dispersing agent, 8 wt % of thixotropic agent, and 5 wt % of PVB.

A method of preparation of the conductive paste for forming a front electrode of crystalline silicon-based solar cell includes:
1) Preparation of Corrosion Binder: Selecting PbO and $TeO_2$ with molar ratio of 3:1 ratio to form a mixture; disposing the mixture material in a vacuum furnace at temperature ~950° C.; thermally inducing solid state reaction for ~1 hour to produce a crystalline Pb—Te—O compound; milling the crystalline Pb—Te—O compound after natural cooling to obtain substantially $Pb_3TeO_5$ compound in powder form.
2) Preparation of Metallic Powder: the metallic powder is silver-coated cobalt powder having particle sizes less than 5.0 μm.

3) Preparation of Glass Frit: Mixing each corresponding component of the Na—Al—B—O-based glass material through a gravity mixer; disposing the mixture into a container loaded in a muffle furnace; heating the mixture up to a peak temperature set to 1000° C. and maintain at the peak temperature for 60 minutes to completely melt the mixture to a uniform liquid; pouring the melt onto a stainless steel platen quench system to obtain a glass material; grinding and milling the glass material into powders with particle sizes being controlled to be less than 5.0 μm.

4) Preparation of Conductive Paste: Selecting individually prepared silver-coated cobalt powder, corrosion binder powder, and glass frit powder in weight compositions; mixing all above powder materials with separately prepared organic carrier in corresponding weight composition to form a uniform mixture; milling the mixture material through a three-roll mill to obtain the conductive paste with all particle sizes less than 5.0 μm.

Example 6

The conductive paste for forming a front electrode of crystalline silicon-based solar cell includes, according to the total weight based on 100 parts, 90 wt % of metallic powder, 4.5 wt % of crystal corrosion binder, 0.5 wt % of glass frit, and 5 wt % of organic carrier. The crystal corrosion binder is substantially $Pb_2Te_3O_8$ compound. The metallic powder is platinum powder. The glass frit is made from Bi—V—Ba—P—O-based glass material containing 5 wt % of $Bi_2O_3$, 45 wt % of $V_2O_5$, 30 wt % of $P_2O_5$, and 20 wt % of BaO. The organic carrier includes 95 wt % of Lauryl Alcohol Ester organic solvent, 1 wt % of Ethyl Cellulose binder, 3 wt % of wetting and dispersing agent, and 1 wt % of thixotropic agent.

A method of preparation of the conductive paste for forming a front electrode of crystalline silicon-based solar cell includes:

1) Preparation of Corrosion Binder: Selecting PbO and $TeO_2$ with molar ratio of 1:4 ratio to form a mixture; disposing the mixture material in a vacuum furnace at temperature of ~900° C.; thermally inducing solid state reaction for ~1 hour to produce a crystalline Pb—Te—O compound; milling the crystalline Pb—Te—O compound after natural cooling to obtain substantially $PbTe_4O_9$ compound in powder form.

2) Preparation of Metallic Powder: the metallic powder is platinum powder having particle sizes less than 5.0 μm.

3) Preparation of Glass Frit: Mixing each corresponding component of the Bi—V—Ba—P—O-based glass material through a gravity mixer; disposing the mixture into a container loaded in a muffle furnace; heating the mixture up to a peak temperature set to 1150° C. and maintain at the peak temperature for 60 minutes to completely melt the mixture to a uniform liquid; pouring the melt onto a stainless steel platen quench system to obtain a glass material; grinding and milling the glass material into powders with particle sizes being controlled to be less than 5.0 μm.

4) Preparation of Conductive Paste: Selecting individually prepared platinum powder, corrosion binder powder, and glass frit powder in weight compositions; mixing all above powder materials with separately prepared organic carrier in corresponding weight composition to form a uniform mixture; milling the mixture material through a three-roll mill to obtain the conductive paste with all particle sizes less than 5.0 μm.

Example 7

The conductive paste for forming a front electrode of crystalline silicon-based solar cell includes, according to the total weight based on 100 parts, 80 wt % of metallic powder, 0.5 wt % of crystal corrosion binder, 3 wt % of glass frit, and 16.5 wt % of organic carrier. The crystal corrosion binder is substantially $PbTeO_3$ compound. The metallic powder is silver-coated chromium powder. The glass frit is made from Pb—Te—Li—O-based glass material containing 21 wt % of PbO, 65.5 wt % of $TeO_2$, 0.5 wt % of $Li_2O$, 8 wt % of $SiO_2$, and 5 wt % of ZnO. The organic carrier includes 70 wt % of Lauryl Alcohol Ester organic solvent, 15 wt % of Ethyl Cellulose binder, 2 wt % of wetting and dispersing agent, 10 wt % of thixotropic agent, and 3 wt % of PVB.

A method of preparation of the conductive paste for forming a front electrode of crystalline silicon-based solar cell includes:

1) Preparation of Corrosion Binder: Selecting PbO and $TeO_2$ with molar ratio of 1:1 ratio to form a mixture; disposing the mixture material in a vacuum furnace at temperature ~900° C.; thermally inducing solid state reaction for ~1 hour to produce a crystalline Pb—Te—O compound; milling the crystalline Pb—Te—O compound after natural cooling to obtain substantially $PbTeO_3$ compound in powder form.

2) Preparation of Metallic Powder: the metallic powder is silver-coated chromium powder having particle sizes less than 5.0 μm.

3) Preparation of Glass Frit: Mixing each corresponding component of the Pb—Te—Li—O-based glass material through a gravity mixer; disposing the mixture into a container loaded in a muffle furnace; heating the mixture up to a peak temperature set to 900° C. and maintain at the peak temperature for 60 minutes to completely melt the mixture to a uniform liquid; pouring the melt onto a stainless steel platen quench system to obtain a glass material; grinding and milling the glass material into powders with particle sizes being controlled to be less than 5.0 μm.

4) Preparation of Conductive Paste: Selecting individually prepared silver-coated copper powder, corrosion binder powder, and glass frit powder in weight compositions; mixing all above powder materials with separately prepared organic carrier in corresponding weight composition to form a uniform mixture; milling the mixture material through a three-roll mill to obtain the conductive paste with all particle sizes less than 5.0 μm.

Further, the conductive paste of the present invention has a functionality to control the dissolving and precipitating of both the silver colloids and the silver crystal grains during the sintering process. This is achieved by controlling the ratio between glass network former, glass network intermediate, and fluxing agent as well as the ratio between the three components of glass network intermediate. As a result, uniform and dense silver colloids and silver crystal grains in a range of about 20 nm to about 150 nm are formed. Oversize or undersize effects of both of the silver colloids and the silver crystal grains are overcome. Controlling the size of the silver crystal grains during the sintering process is important. If the silver crystal grains are oversized, they might penetrate the emitter to the P—N junction, cause a short circuit and solar cell failure. Especially for crystalline silicon solar cells with shallow doped high sheet resistance (sheet resistance >75 Ω/sq.), its emitter is thinner and easily be broken. The conductive paste of the present invention has a functionality to control the silver crystal grain size in an optimum range of 20-150 nm during the sintering process. If the silver crystal grains are undersized or non-uniformly distributed, photon-generated charge carriers are consumed before arriving at the silver crystal grains, causing not only lower short-circuit current but also lower filling factor. If less silver colloids are produced during the sintering process, the resistance between the silver bulk and the emitters is high, which causes higher series resistance and lower filling factor of the solar cell. If the silver colloids precipitate too close to the reaction interface, the silver colloids cannot conduct the photon-generated charge carriers from the emitter to the silver bulk to obtain suitable series resistance and filling factor.

Finally, the above-discussion of the embodiments, comparatives, and reference are intended to be mere illustrations of the present invention and should not be construed as limiting the appended claims to any particular embodiment or group of embodiments. Thus, while the invention has been described with reference to exemplary embodiments, it should also be appreciated that numerous modifications and alternative embodiments may be devised by those having ordinary skill in the art without departing from the broader and intended spirit and scope of the disclosure as set forth in the claims that follow. In addition, the section headings included herein are intended to facilitate a review but are not intended to limit the scope of the present system. Accordingly, the specification and drawings are to be regarded in an illustrative manner and are not intended to limit the scope of the appended claims.

What is claimed is:

1. A method for forming a conductive paste, the method comprising:
   providing a plurality of metal particles with a weight composition ranging from 70 to 93 wt % based on a given total weight of the conductive paste;
   providing an organic carrier with a weight composition ranging from 5 to 25 wt % based on the given total weight;
   providing a corrosion binder made from a plurality of Pb—Te—O-based crystalline particles and a glass frit made from a plurality of glass particles with a combined weight composition ranging from 2 to 15 wt % based on the given total weight, wherein the providing a corrosion binder comprises:
      mixing tellurium solution with lead acetate solution with a molar ratio selected from 2:3, 1:1, 1:4, and 3:1;
      stirring the mixed solution at 80~150° C. with a stirring speed in the range of 800~2500 r/min for 2~4 hours to generate precipitate from a reaction between Tellurium and Lead Acetate;
      collecting the precipitate by solid-liquid separation;
      washing the precipitate with deionized water until filtration water PH value in a range of 5~7 to obtain a solid material; and
      drying the solid material at about 150° C. for 2 hours to yield a plurality of Pb—Te—O-based crystalline particles;
   mixing the plurality of metal particles, the corrosion binder, the glass frit, and the organic carrier to form a mixture material; and
   grinding the mixture material to keep sizes of all the plurality of metal particles, the plurality of Pb—Te—O-based crystalline particles, and the plurality of glass particles substantially in a range of 0.1 to 5.0 μm.

2. The method of claim 1 wherein each of the plurality of glass particles comprises one or a combination of two or more selected from Pb—Si—O, Bi—Si—O, Pb—B—O, Bi—B—O, Pb—Te—O, Bi—Te—O, P—Zn—Na—O, B—Al—Na—O, B—Zn—Ba—O, and V—P—Ba—O-based glass materials characterized by a glass softening transition temperature in a range of 500° C. to 650° C. and a physical size substantially in a range from 0.1 to 5.0 microns.

3. The method of claim 1 wherein each of the plurality of metal particles comprises one metal material selected from silver, gold, platinum, copper, iron, nickel, zinc, titanium, cobalt, chromium, manganese, palladium, and rhodium or a metal alloy of two or more of them.

4. The method of claim 1 wherein the plurality of metal particles comprises one metal material selected from copper, iron, nickel, zinc, titanium, cobalt, chromium, and manganese or a metal alloy of two or more of them, and at least 5% or more of the plurality of metal particles are respectively coated by a thickness of silver layer in a range of 1~2000 nm.

5. The method of claim 1 wherein the glass frit and the corrosion binder comprise a weight composition ratio ranging from 5:95 to 95:5 per any fixed amount of the conductive paste.

6. A method for forming a conductive paste, the method comprising:
   providing a plurality of metal particles with a weight composition ranging from 70 to 93 wt % based on a given total weight of the conductive paste;
   providing an organic carrier with a weight composition ranging from 5 to 25 wt % based on the given total weight;
   providing a corrosion binder made from a plurality of Pb—Te—O-based crystalline particles and a glass frit made from a plurality of glass particles with a combined weight composition ranging from 2 to 15 wt % based on the given total weight, wherein the providing corrosion binder comprises:
      providing $Pb_xTe_y$ alloy vapor into a chamber in oxygen atmosphere, wherein y:x ratio is selected from 2:3, 1:1, 1:4, and 3:1;
      heating the chamber to temperatures in a range of 1000~1400° C. for 2 to 4 hours to form a Pb—Te—O-based compound in vapor phase;
      cooling the Pb—Te—O-based compound naturally to room temperature to form a solid phase from the vapor phase, yielding a plurality of Pb—Te—O-based crystalline particles;
   mixing the plurality of metal particles, the corrosion binder, the glass frit, and the organic carrier to form a mixture material; and
   grinding the mixture material to keep sizes of all the plurality of metal particles, the plurality of Pb—Te—O-based crystalline particles, and the plurality of glass particles substantially in a range of 0.1 to 5.0 μm.

7. The method of claim 6 wherein each of the plurality of glass particles comprises one or a combination of two or more selected from Pb—Si—O, Bi—Si—O, Pb—B—O, Bi—B—O, Pb—Te—O, Bi—Te—O, P—Zn—Na—O, B—Al—Na—O, B—Zn—Ba—O, and V—P—Ba—O-based glass materials characterized by a glass softening transition temperature in a range of 500° C. to 650° C. and a physical size substantially in a range from 0.1 to 5.0 microns.

8. The method of claim 6 wherein each of the plurality of metal particles comprises one metal material selected from silver, gold, platinum, copper, iron, nickel, zinc, titanium, cobalt, chromium, manganese, palladium, and rhodium or a metal alloy of two or more of them.

9. The method of claim 6 wherein the plurality of metal particles comprises one metal material selected from copper, iron, nickel, zinc, titanium, cobalt, chromium, and manganese or a metal alloy of two or more of them, and at least 5% or more of the plurality of metal particles are respectively coated by a thickness of silver layer in a range of 1~2000 nm.

10. The method of claim 6 wherein the glass frit and the corrosion binder comprise a weight composition ratio ranging from 5:95 to 95:5 per any fixed amount of the conductive paste.

11. A method for forming a conductive paste, the method comprising:
providing a plurality of metal particles with a weight composition ranging from 70 to 93 wt % based on a given total weight of the conductive paste;
providing an organic carrier with a weight composition ranging from 5 to 25 wt % based on the given total weight;
providing a corrosion binder made from a plurality of Pb—Te—O-based crystalline particles and a glass frit made from a plurality of glass particles with a combined weight composition ranging from 2 to 15 wt % based on the given total weight, wherein the providing the corrosion binder comprises:
providing tellurium oxide and lead oxide in a vacuum atmosphere;
melting the tellurium oxide and the lead oxide at 500~900° C. to form a molten mixture;
cooling the molten mixture gradually with a rate smaller than 45° C./minute to obtain a Pb—Te—O-based crystal bulk;
pulverizing the Pb—Te—O-based crystal bulk to small chunks; and
grinding the small chunks to obtain a plurality of Pb—Te—O-based crystalline particles;
mixing the plurality of metal particles, the corrosion binder, the glass frit, and the organic carrier to form a mixture material; and
grinding the mixture material to keep sizes of all the plurality of metal particles, the plurality of Pb—Te—O-based crystalline particles, and the plurality of glass particles substantially in a range of 0.1 to 5.0 μm.

12. The method of claim 11 wherein each of the plurality of glass particles comprises one or a combination of two or more selected from Pb—Si—O, Bi—Si—O, Pb—B—O, Bi—B—O, Pb—Te—O, Bi—Te—O, P—Zn—Na—O, B—Al—Na—O, B—Zn—Ba—O, and V—P—Ba—O-based glass materials characterized by a glass softening transition temperature in a range of 500° C. to 650° C. and a physical size substantially in a range from 0.1 to 5.0 microns.

13. The method of claim 11 wherein each of the plurality of metal particles comprises one metal material selected from silver, gold, platinum, copper, iron, nickel, zinc, titanium, cobalt, chromium, manganese, palladium, and rhodium or a metal alloy of two or more of them.

14. The method of claim 11 wherein the plurality of metal particles comprises one metal material selected from copper, iron, nickel, zinc, titanium, cobalt, chromium, and manganese or a metal alloy of two or more of them, and at least 5% or more of the plurality of metal particles are respectively coated by a thickness of silver layer in a range of 1~2000 nm.

15. The method of claim 11 wherein the glass frit and the corrosion binder comprise a weight composition ratio ranging from 5:95 to 95:5 per any fixed amount of the conductive paste.

* * * * *

UNITED STATES PATENT AND TRADEMARK OFFICE
CERTIFICATE OF CORRECTION

PATENT NO.        : 9,023,253 B2  
APPLICATION NO.   : 13/787997  
DATED             : May 5, 2015  
INVENTOR(S)       : Xiaoli Liu, Ran Guo and Delin Li It is certified that error appears in the above-identified patent and that said Letters Patent is hereby corrected as shown below:

On the title page item (73), should read:  
Assignee: Soltrium Advanced Materials Technology, Ltd. Shenzhen Signed and Sealed this  
Twenty-second Day of December, 2015

Michelle K. Lee  
*Director of the United States Patent and Trademark Office*